(12) United States Patent
Spory

(10) Patent No.: US 9,966,319 B1
(45) Date of Patent: May 8, 2018

(54) ENVIRONMENTAL HARDENING INTEGRATED CIRCUIT METHOD AND APPARATUS

(71) Applicant: Erick Merle Spory, Colorado Springs, CO (US)

(72) Inventor: Erick Merle Spory, Colorado Springs, CO (US)

(73) Assignee: Global Circuit Innovations Incorporated, Colorado Springs, CO (US)

( * ) Notice: Subject to any disclaimer, the term of this patent is extended or adjusted under 35 U.S.C. 154(b) by 1031 days.

(21) Appl. No.: 13/785,959

(22) Filed: Mar. 5, 2013

Related U.S. Application Data

(63) Continuation-in-part of application No. 13/623,603, filed on Sep. 20, 2012, which is a continuation of application No. 13/283,293, filed on Oct. 27, 2011.

(51) Int. Cl.
H01L 21/04 (2006.01)
H01L 23/04 (2006.01)
H01L 21/52 (2006.01)

(52) U.S. Cl.
CPC .............. *H01L 23/04* (2013.01); *H01L 21/52* (2013.01)

(58) Field of Classification Search
CPC ................................ H01L 21/52; H01L 23/04
USPC ................................................. 438/118, 456
See application file for complete search history.

(56) References Cited

U.S. PATENT DOCUMENTS

| | | | |
|---|---|---|---|
| 4,426,769 A * | 1/1984 | Grabbe | ........................... 29/832 |
| 4,622,433 A | 11/1986 | Frampton | |
| 5,064,782 A | 11/1991 | Nishiguchi | |
| 5,219,794 A | 6/1993 | Satoh | |
| 5,243,756 A | 9/1993 | Hamburgen et al. | |
| 5,517,127 A | 5/1996 | Bergeron | |
| 5,598,031 A | 1/1997 | Groover et al. | |
| 5,783,464 A | 7/1998 | Burns | |
| 5,783,868 A | 7/1998 | Galloway | |
| 5,847,467 A | 12/1998 | Wills | |

(Continued)

FOREIGN PATENT DOCUMENTS

WO    WO2011-101272 A1    8/2011

OTHER PUBLICATIONS

Flip Chips dot com, Tutorial 72—Mar. 2007, Redistribution Layers, article by George A. Riley, PhD, Flipchips dot com website, downloaded Dec. 18, 2011: http://www.flipchips.com/tutorial72.html.

(Continued)

*Primary Examiner* — Matthew Reames
*Assistant Examiner* — Wilner Jean Baptiste
(74) *Attorney, Agent, or Firm* — Thomas J. Lavan

(57) ABSTRACT

A method for assembling a packaged integrated circuit for operating reliably at elevated temperatures is provided. The method includes providing an extended bond pad over an original die pad of an extracted die to create a modified extracted die. The extracted die is a fully functional semiconductor die that has been removed from a finished packaged integrated circuit. The method also includes placing the modified extracted die into a cavity of a package base and bonding a new bond wire between the extended bond pad and a lead of the package base or a downbond, and sealing a package lid to the package base and the cavity of the package.

9 Claims, 14 Drawing Sheets

(56) References Cited

U.S. PATENT DOCUMENTS

| | | | |
|---|---|---|---|
| 5,936,758 A | 8/1999 | Fisher et al. | |
| 6,100,108 A | 8/2000 | Mizuno et al. | |
| 6,100,581 A | 8/2000 | Wakefield et al. | |
| 6,169,331 B1 | 1/2001 | Manning | |
| 6,429,028 B1 | 8/2002 | Young | |
| 6,472,725 B1 | 10/2002 | Stroupe | |
| 7,067,332 B1 | 6/2006 | Chowdhury | |
| 7,294,533 B2 | 11/2007 | Lebonheur | |
| 7,759,800 B2* | 7/2010 | Rigg et al. | 257/774 |
| 7,833,880 B2* | 11/2010 | Rizzi | 438/456 |
| 8,421,227 B2 | 4/2013 | Lin | |
| 2001/0019176 A1 | 9/2001 | Ahiko et al. | |
| 2002/0084528 A1 | 7/2002 | Kim et al. | |
| 2002/0182782 A1 | 12/2002 | Farnworth | |
| 2003/0127423 A1 | 7/2003 | Dlugokecki | |
| 2004/0006150 A1 | 1/2004 | Murray et al. | |
| 2004/0040855 A1* | 3/2004 | Batinovich | 205/123 |
| 2004/0056072 A1* | 3/2004 | Chapman et al. | 228/180.5 |
| 2005/0057883 A1 | 3/2005 | Bolken | |
| 2005/0085578 A1 | 4/2005 | Iguchi | |
| 2005/0285250 A1 | 12/2005 | Jeong | |
| 2006/0068595 A1* | 3/2006 | Seliger et al. | 438/737 |
| 2006/0166406 A1 | 7/2006 | Lin | |
| 2007/0007661 A1 | 1/2007 | Burgess | |
| 2007/0259470 A1 | 11/2007 | Quenzer et al. | |
| 2007/0295456 A1 | 12/2007 | Gudeman | |
| 2008/0124547 A1* | 5/2008 | O et al. | 428/379 |
| 2008/0197469 A1 | 8/2008 | Yang et al. | |
| 2008/0230922 A1 | 9/2008 | Mochizuki | |
| 2009/0072413 A1 | 3/2009 | Mahler | |
| 2009/0085181 A1 | 4/2009 | Advincula, Jr. | |
| 2009/0151972 A1 | 6/2009 | Potter | |
| 2009/0160047 A1 | 6/2009 | Otsuka | |
| 2010/0007367 A1* | 1/2010 | Spielberger et al. | 324/765 |
| 2010/0079035 A1 | 4/2010 | Matsuzawa et al. | |
| 2010/0140811 A1* | 6/2010 | Leal et al. | 257/777 |
| 2010/0200262 A1 | 8/2010 | Mahapatra et al. | |
| 2010/0246152 A1 | 9/2010 | Lin et al. | |
| 2010/0314754 A1 | 12/2010 | Zhang | |
| 2011/0215449 A1 | 9/2011 | Camacho et al. | |
| 2011/0298137 A1* | 12/2011 | Pagaila | H01L 21/561 257/773 |
| 2012/0177853 A1 | 7/2012 | Gruenwald | |
| 2012/0217643 A1 | 8/2012 | Pagaila | |
| 2013/0207248 A1 | 8/2013 | Bensoussan et al. | |
| 2016/0225686 A1 | 8/2016 | Spory | |

OTHER PUBLICATIONS

MIT article "Liquid Metal Printer Lays Electronic Circuits on Paper, Plastic, and even Cotton", downloaded from MIT Technology Review Nov. 22, 2013, http://www.technologyreview.com/view/521871/liquid-metal-printer-lays-electronic-circuits-on-paper-plastic-and-even-cotton/.

sPRO 125 and sPRO 250 Direct Metal SLM Production Printer datasheet, 3DSystems, Part No. 70743, Issue Date Apr. 10, 2012.

Getters—molecular scavengers for packaging, Dr. Ken Gilleo and Steve Corbett, HDI Jan. 2001, www.hdi-online.com, 4 pages.

Cookson Group STAYDRY SD1000 High Temperature Moisture Getter data sheet, Cookson Group, May 30, 2011, 1 page.

Wikipdia "Getter", retrieved May 30, 2011, http://en.wikipedia.org/wiki/Getter.

Wikipdia "Kirkendall effect", retrieved Jul. 5, 2011, http://en.wikipedia.org/wiki/Kirkendall effect.

Wikipedia "3D Printing" reference, downloaded Jan. 12, 2015.

Wikipedia "Screen printing" reference, downloaded Jan. 12, 2015.

Official Action for U.S. Appl. No. 13/623,603, dated Dec. 9, 2014.

Official Action for U.S. Appl. No. 14/142,823, dated Jan. 5, 2015.

Official Action for U.S. Appl. No. 13/623,603, dated Apr. 16, 2015.

Official Action for U.S. Appl. No. 14/142,823, dated May 11, 2015.

Official Action for U.S. Appl. No. 14/600,733, dated Apr. 17, 2015.

Wikipedia "3D Printing" reference, downloaded Jan. 12, 2015, https://en.wikipedia.org/wiki/3D_printing.

Wikipedia "Screen printing" reference, downloaded Jan. 12, 2015, https://en.wikipedia.org/wiki/Screen_printing.

Official Action for U.S. Appl. No. 14/142,823, dated Oct. 9, 2015.

Official Action for U.S. Appl. No. 14/565,626, dated Aug. 28, 2015.

Official Action for U.S. Appl. No. 14/600,691, dated Aug. 10, 2015.

Official Action for U.S. Appl. No. 13/623,603, dated Aug. 14, 2015.

Official Action for U.S. Appl. No. 14/600,733, dated Sep. 9, 2015.

Official Action for U.S. Appl. No. 14/600,691, dated Dec. 27, 2016.

Official Action for U.S. Appl. No. 14/600,733, dated Dec. 2, 2016.

Official Action for U.S. Appl. No. 13/623,603, dated Aug. 24, 2016.

Official Action for U.S. Appl. No. 14/600,733, dated Aug. 23, 2016.

Official Action for U.S. Appl. No. 14/600,691, dated Jul. 29, 2016.

Official Action for U.S. Appl. No. 14/142,823, dated Jul. 28, 2016.

Wikipedia "Ball Bonding", downloaded Apr. 11, 2016.

Solid State Technology "The back-end process: Step 7—Solder bumping step by step", by Deborah S. Patterson, http://electroiq.com/blog/2001/07/the-back-end-process-step-7-solder-bumping-step-by-step/, downloaded Apr. 11, 2016.

Official Action for U.S. Appl. No. 14/142,823, dated Feb. 29, 2016.

Official Action for U.S. Appl. No. 14/600,691, dated Feb. 19, 2016.

Official Action for U.S. Appl. No. 14/600,733, dated May 9, 2016.

Official Action for U.S. Appl. No. 13/623,603, dated Apr. 29, 2016.

Notice of Allowance for U.S. Appl. No. 14/600,691, dated Jun. 6, 2017.

Official Action for U.S. Appl. No. 15/088,822, dated Mar. 24, 2017.

Official Action for U.S. Appl. No. 13/623,603, dated Apr. 11, 2017.

Official Action for U.S. Appl. No. 13/623,603, dated Jan. 16, 2018.

Notice of Allowance for U.S. Appl. No. 14/142,823, dated Nov. 30, 2017.

Notice of Allowance for U.S. Appl. No. 14/142,823, dated Feb. 16, 2018.

Notice of Allowance for U.S. Appl. No. 14/600,733, dated Oct. 5, 2017.

Notice of Allowance for U.S. Appl. No. 15/088,822, dated Nov. 13, 2017.

Notice of Allowance for U.S. Appl. No. 15/088,822, dated Aug. 15, 2017.

\* cited by examiner

Fig. 1 Extracted die with bond pads and ball bonds
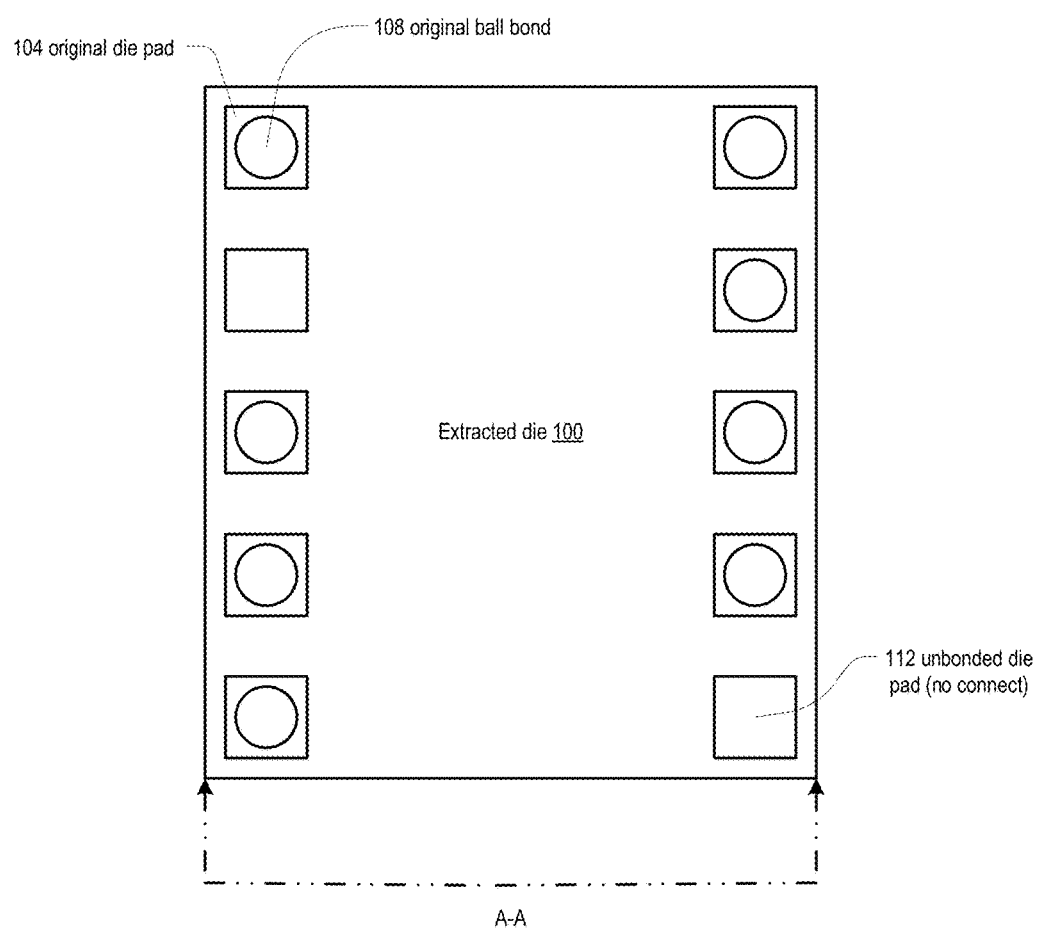

*Fig. 2a Extended bond pad first geometry*
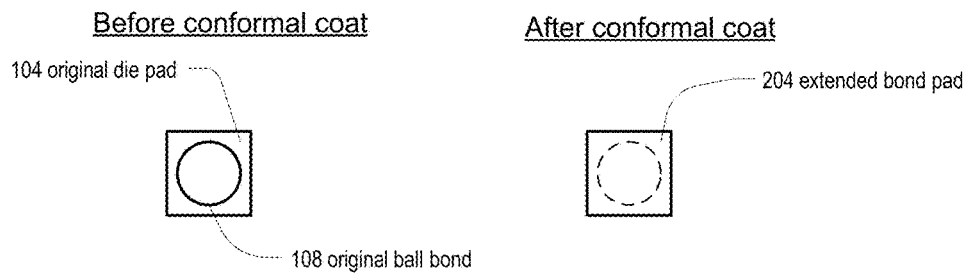
*Fig. 2b Extended bond pad second geometry*
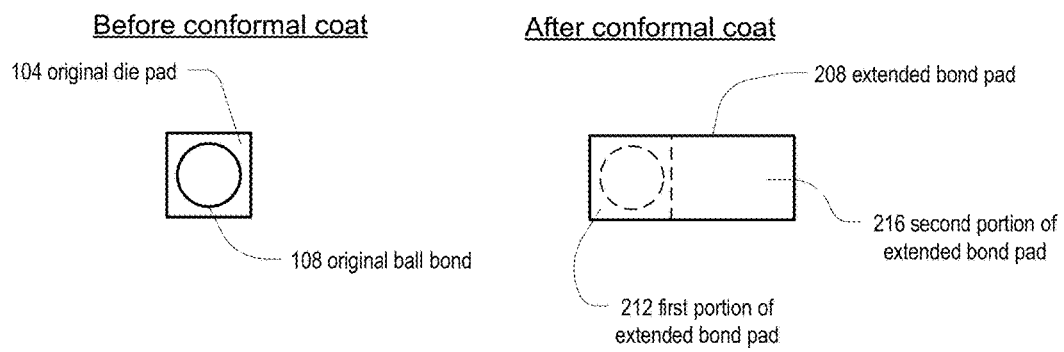
*Fig. 2c Extended bond pad third geometry*
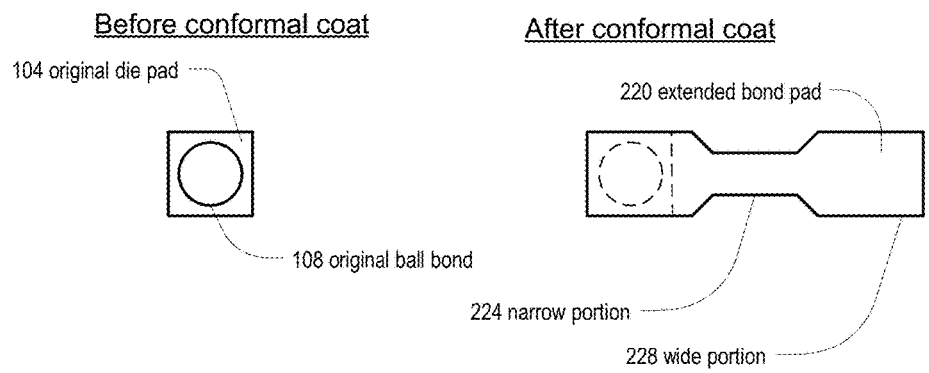

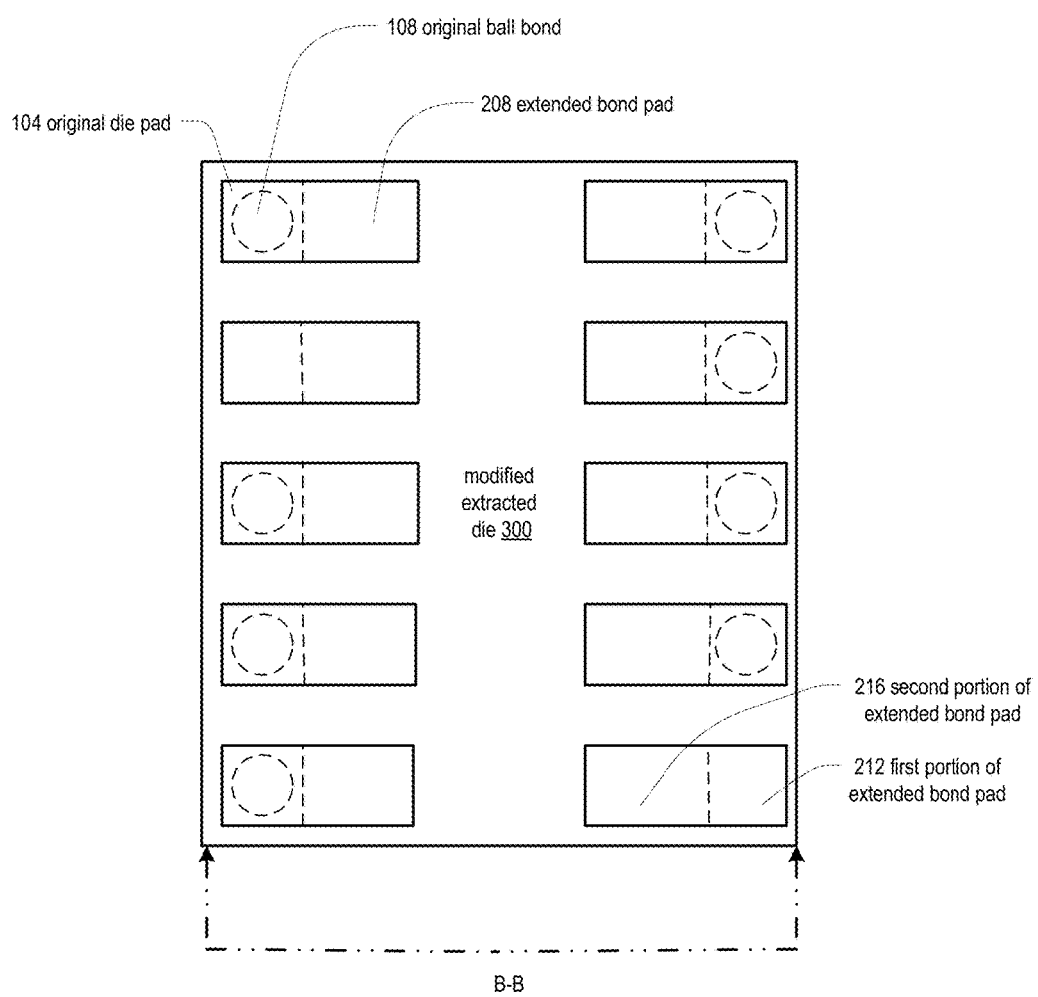
Fig. 3 Extracted die with extended bond pads of second geometry

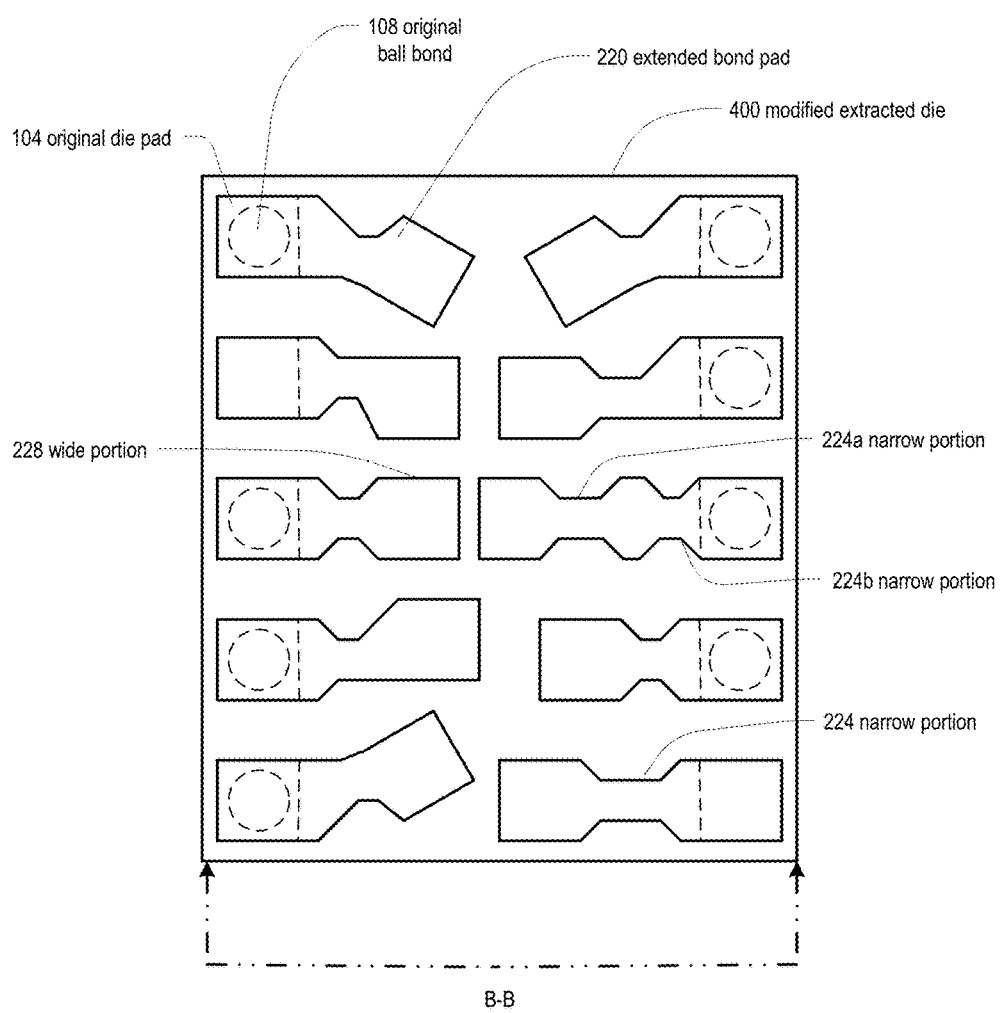
Fig. 4 Extracted die with extended bond pads of third geometry

Fig. 5 Rebonded extracted die with new ball bonds and bond wires
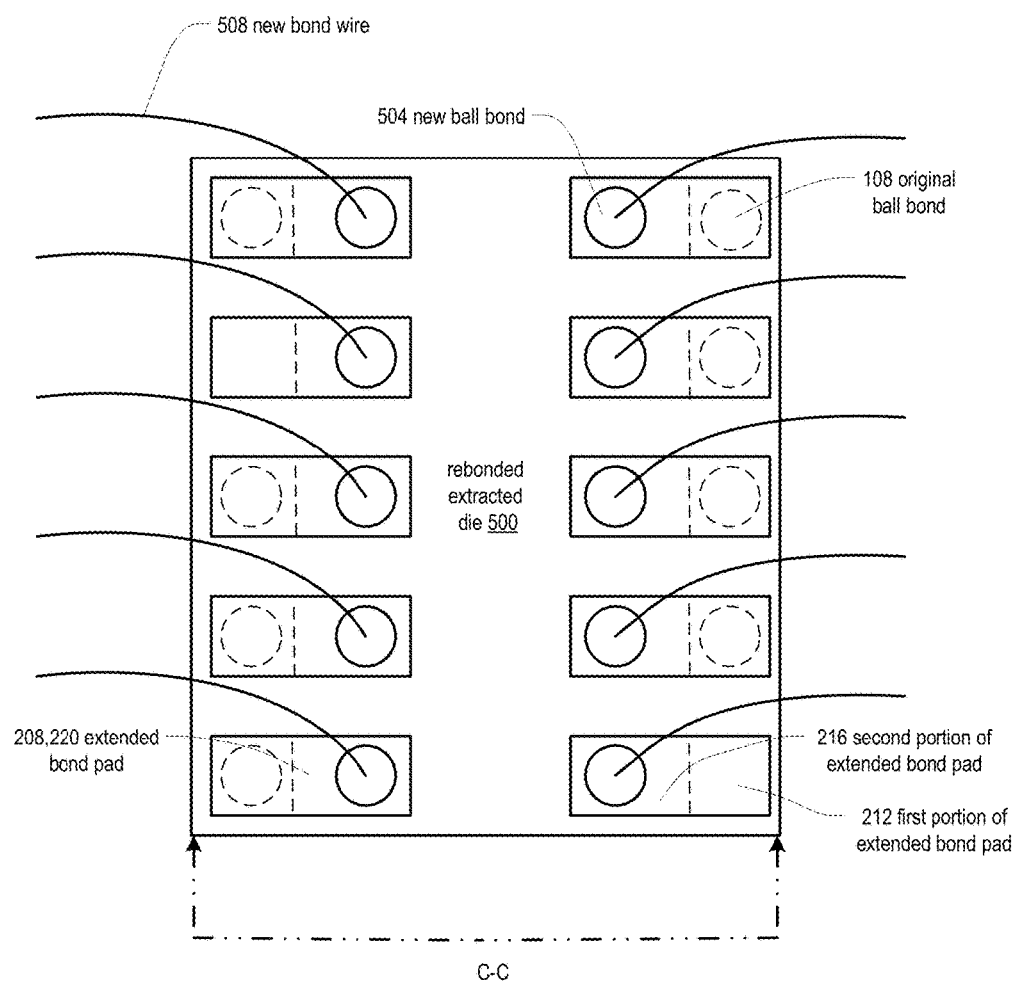

*Fig. 6a Extracted die section A-A*
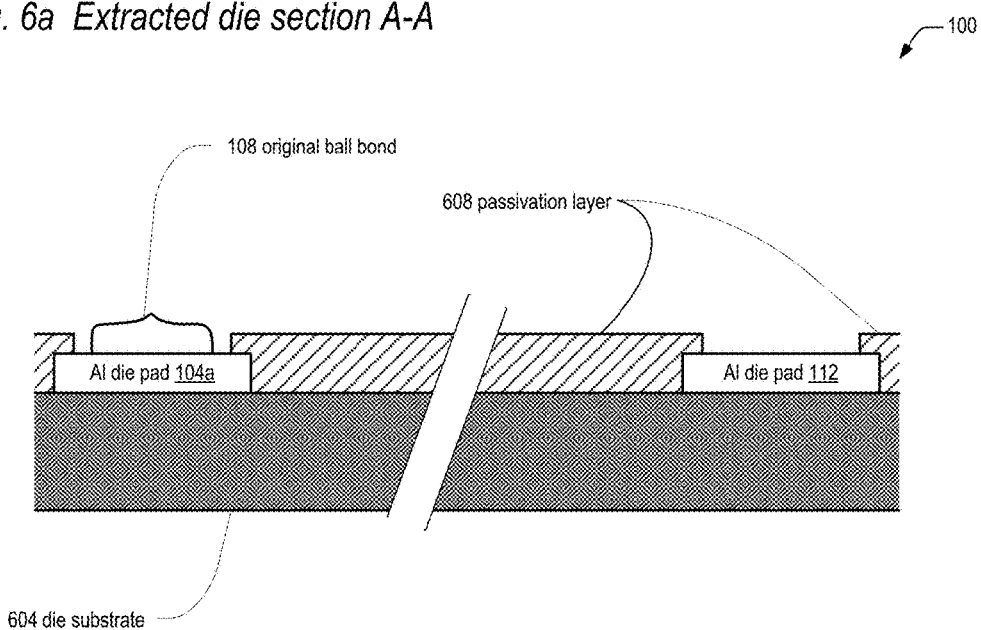
*Fig. 6b Modified extracted die section B-B after conformal coat process*
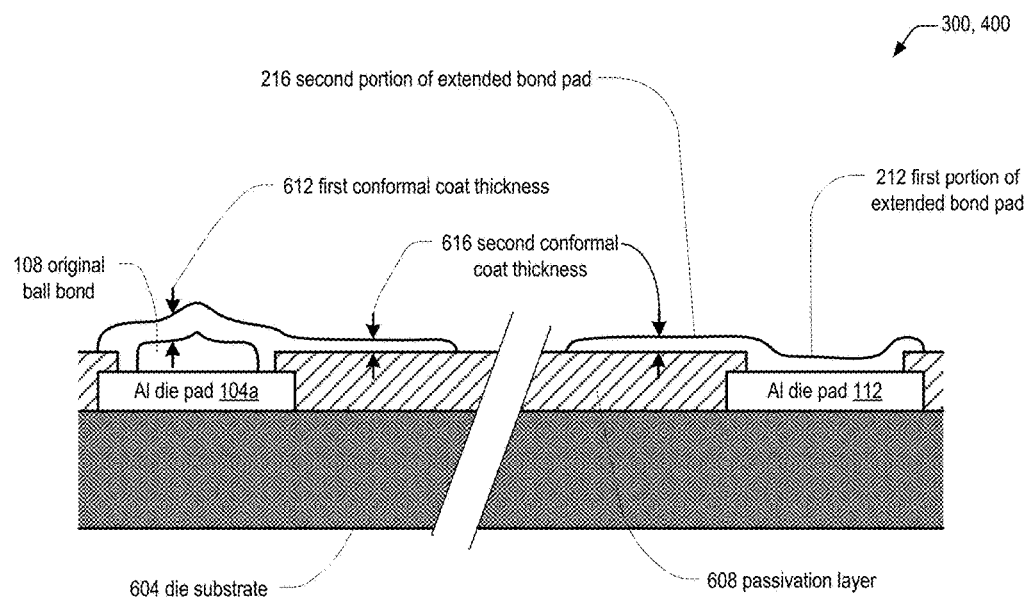

*Fig. 6c Rebonded extracted die section C-C after rebonding process*
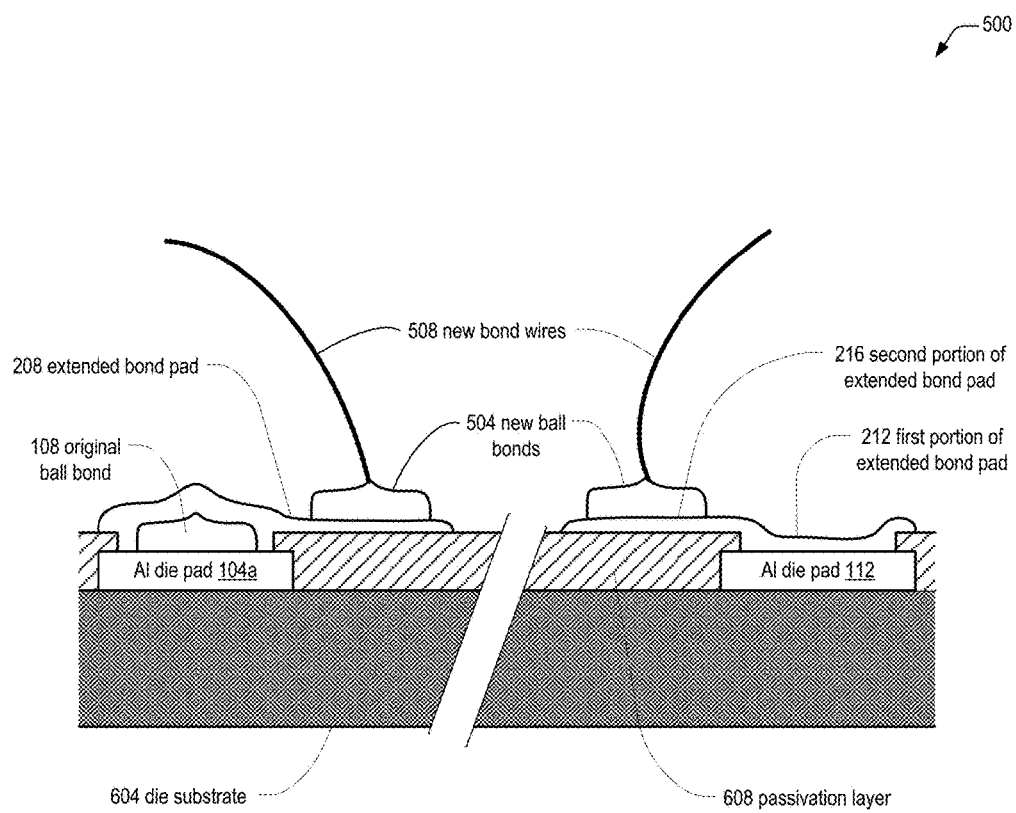

*Fig. 7a Conformal coat stackup, first embodiment*
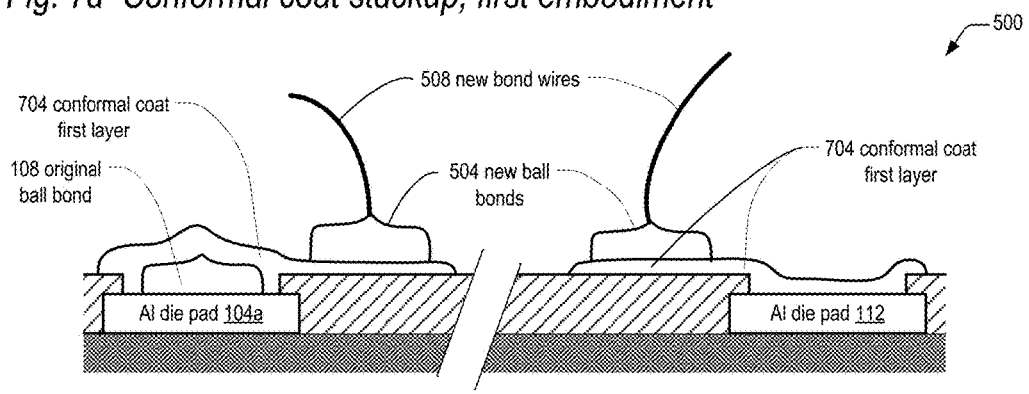
*Fig. 7b Conformal coat stackup, second embodiment*
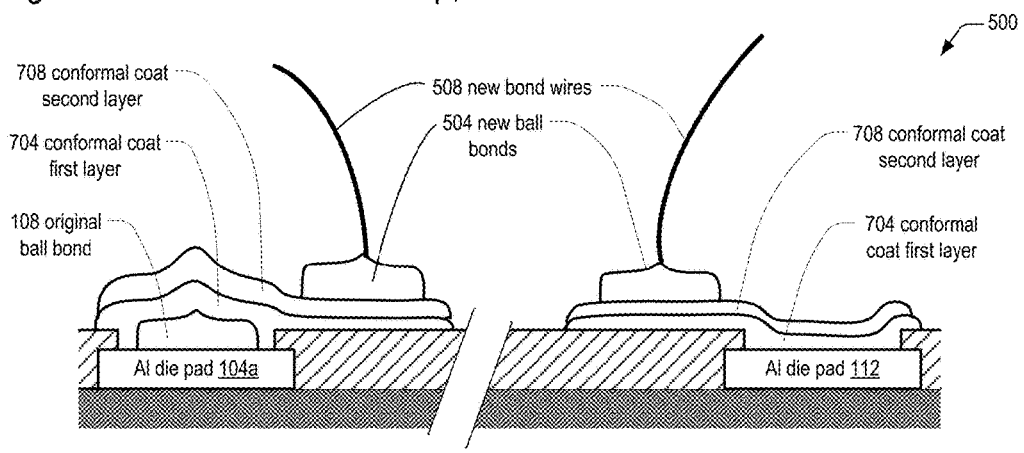
*Fig. 7c Conformal coat stackup, third embodiment*
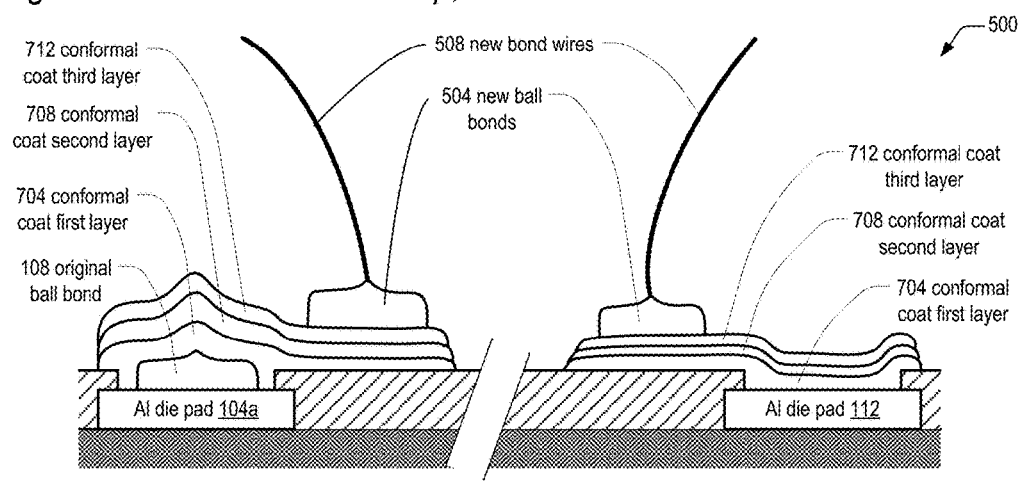

Fig. 8a  Assembled package base
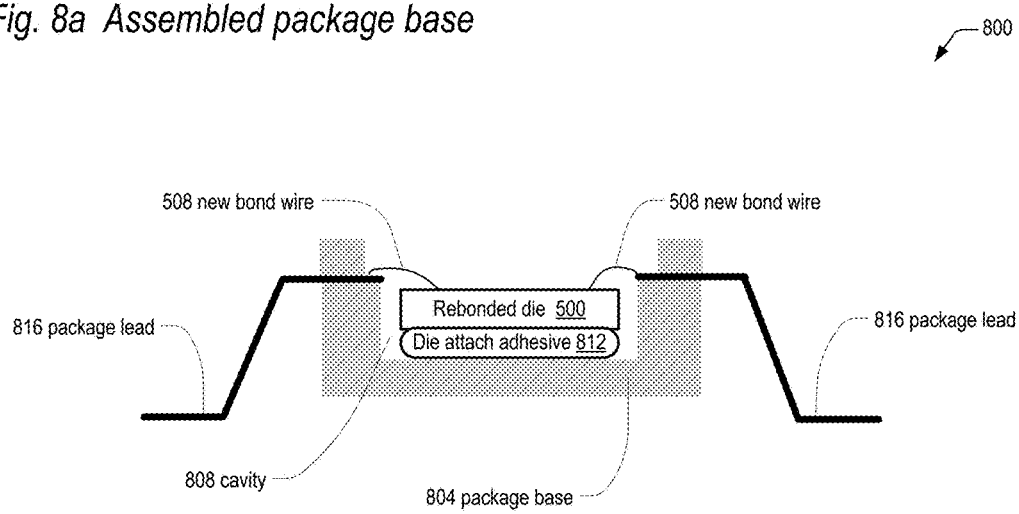
Fig. 8b  Repackaged environmentally hardened integrated circuit
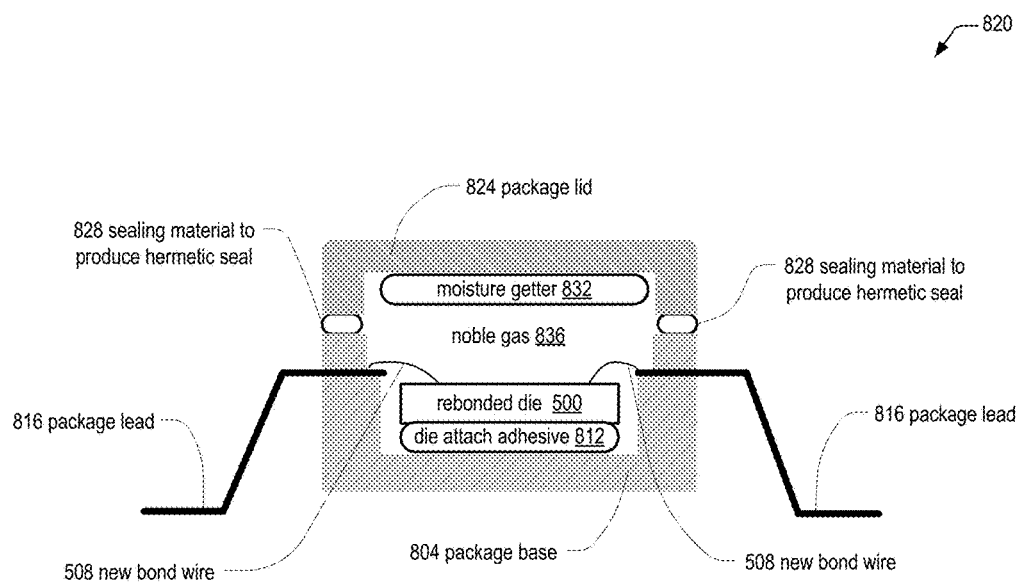

*Fig. 9 3D printing an extended bond pad*
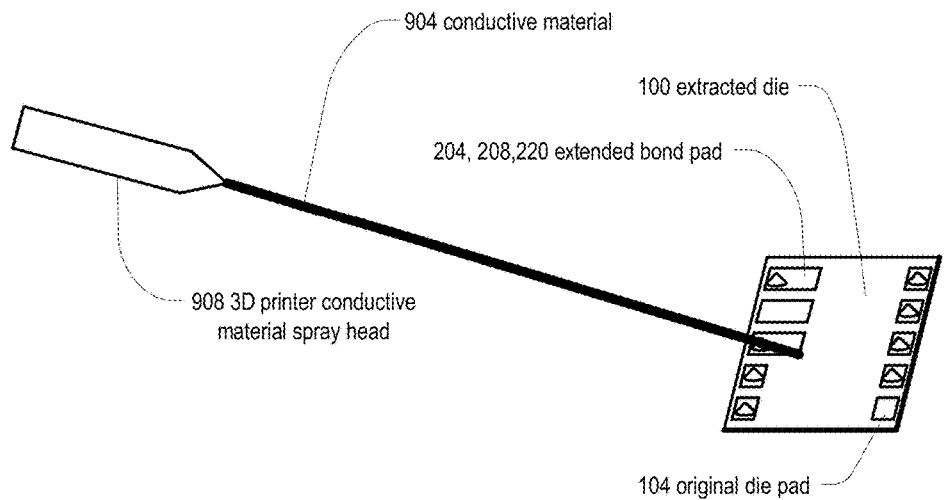

Fig. 10 Assembly method for repackaged environmentally hardened integrated circuit
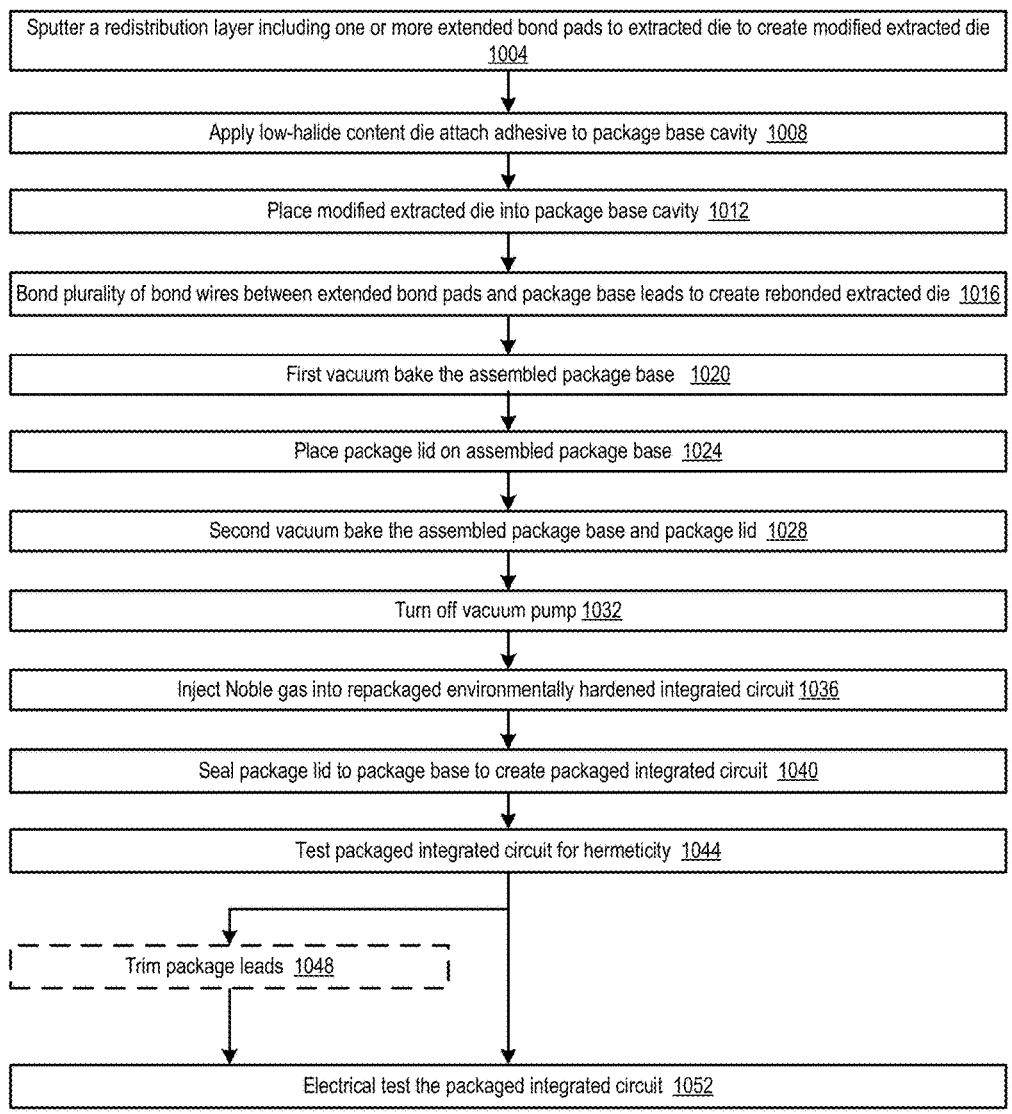

Fig. 11 Assembly method for repackaged environmentally hardened integrated circuit
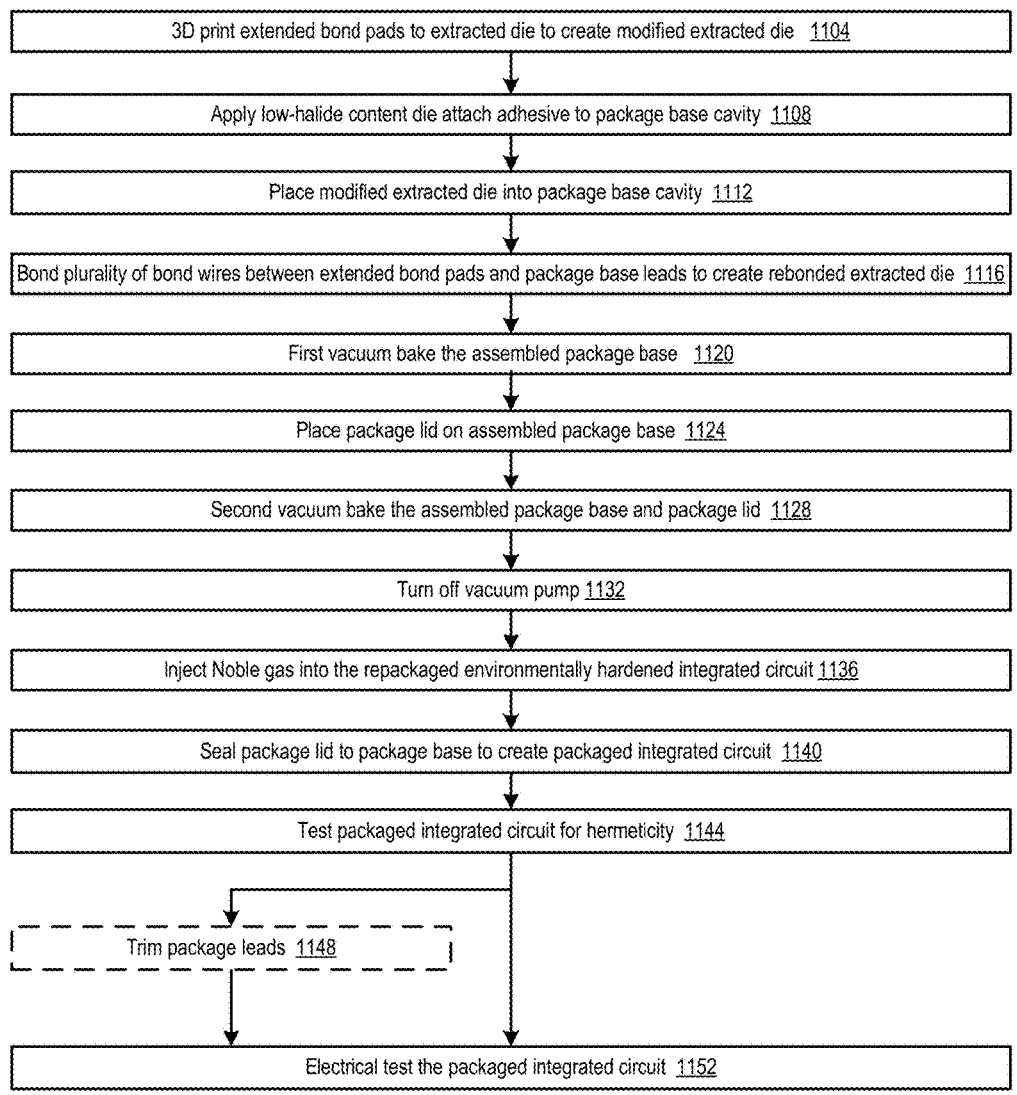

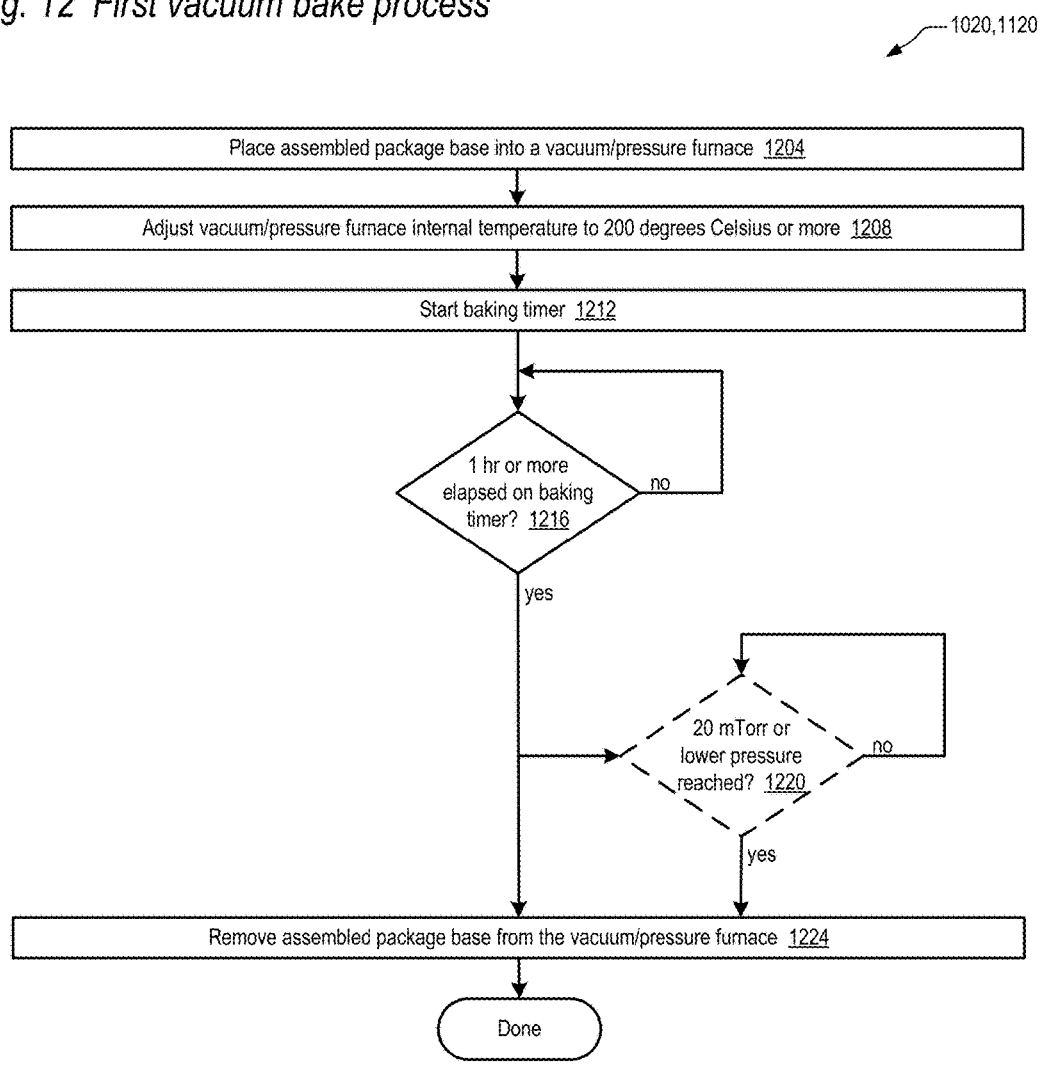
Fig. 12 First vacuum bake process

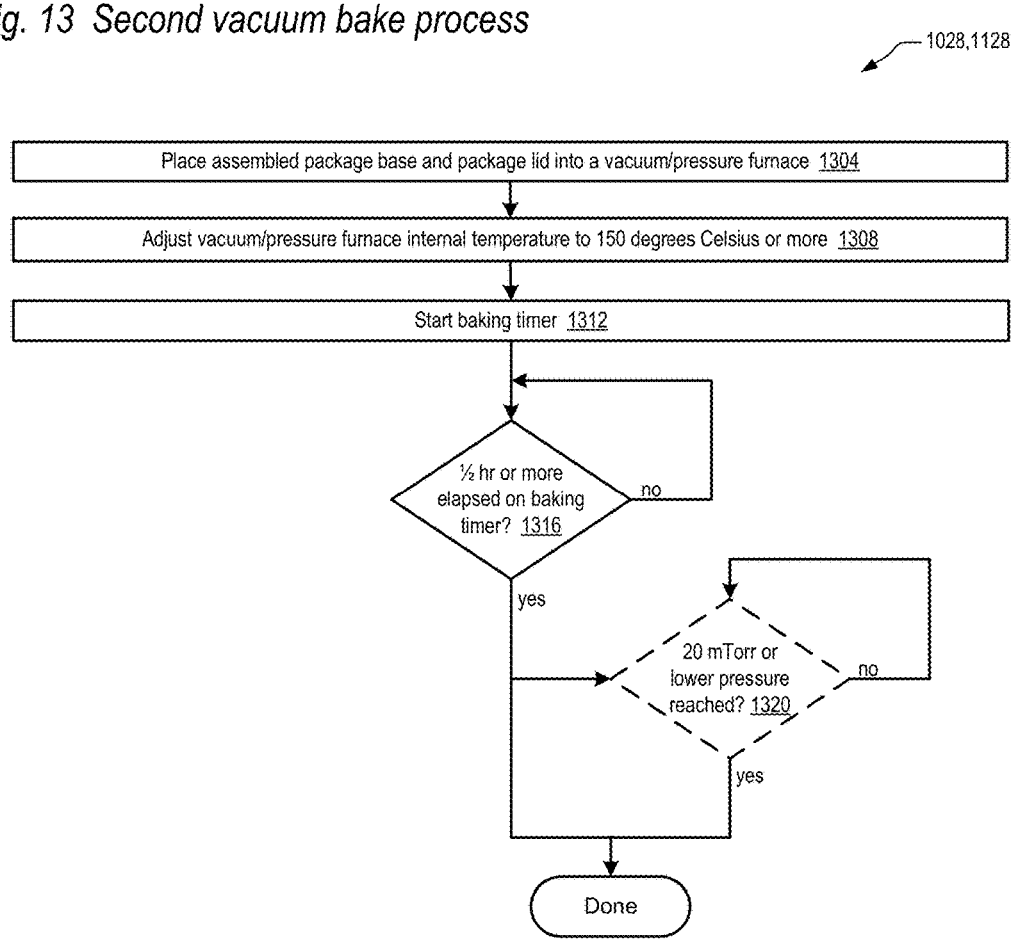
Fig. 13 Second vacuum bake process

ENVIRONMENTAL HARDENING INTEGRATED CIRCUIT METHOD AND APPARATUS

CROSS REFERENCE TO RELATED APPLICATION(S)

This application is a Continuation-in-Part of pending U.S. application Ser. No. 13/623,603, filed Sep. 20, 2012, entitled ENVIRONMENTAL HARDENING TO EXTEND OPERATING LIFETIMES OF INTEGRATED CIRCUITS AT ELEVATED TEMPERATURES, which is hereby incorporated by reference for all purposes, which is a Continuation of U.S. application Ser. No. 13/283,293 filed Oct. 27, 2011, entitled ENVIRONMENTAL HARDENING TO EXTEND OPERATING LIFETIMES OF INTEGRATED CIRCUITS AT ELEVATED TEMPERATURES, now abandoned.

FIELD

The present invention is directed to integrated circuit packaging. In particular, the present invention is directed to methods and apparatuses for creating environmentally hardened packaged integrated circuits capable of operating at extended temperatures over extended lifetimes.

BACKGROUND

Integrated circuits are available in many different packages, technologies, and sizes. Most integrated circuits are available in plastic packages, which are generally intended for commercial operating environments at a low cost. Commercial operating environments have a specified operating range from 0° C. to 70° C. Integrated circuits for military applications have historically been packaged in either metal or ceramic hermetic packages, which are able to work reliably in more demanding environments than commercial integrated circuits. Military operating environments have a specified operating range from −55° C. to 125° C. In order to save costs, the military has purchased integrated circuits through COTS (Commercial Off-The-Shelf) programs. However, these components are generally commercial grade components in plastic packages, and not intended for demanding environments requiring the broader temperature range reliability and durability of ceramic and metal hermetically packaged integrated circuits.

Depending on size and complexity, integrated circuits are available in a wide range of packages. Although many older integrated circuits were packaged using through-hole technology packages, surface mount packages have dominated over the past several decades. Surface mount packages generally have circuit density, cost, and other advantages over through-hole integrated circuits. Examples of through-hole packages include DIP (dual-in-line plastic) and PGA (pin grid array). Examples of surface mount packages include SOIC (small-outline integrated circuit) and PLCC (plastic leaded chip carrier).

In many cases, products requiring integrated circuits are in production or service for a longer time period than the manufacturing lifetime of a given integrated circuit. In such cases, it is not uncommon for parts to become obsolete or become unable to be purchased. For example, in a typical month, about 3% of all packaged integrated circuit product types become obsolete. One mitigating approach to this issue is to buy a sufficient lifetime inventory of spares for integrated circuits that are likely to become obsolete at a future date. However, this may be costly if a large quantity of integrated circuits needs to be purchased as spares. It also may result in far more spares being purchased that are actually required, since projected future needs may only be a rough estimate. If spares are needed in the future, when an IC is no longer in active production, the ICs that are actually available may be in a different package than is required, since popular ICs are typically offered in multiple package options. For example, spares may be available in plastic DIP packages while qualified assemblies require SOIC packages.

SUMMARY

The present invention is directed to solving disadvantages of the prior art. In accordance with embodiments of the present invention, a method for assembling a packaged integrated circuit for operating reliably at elevated temperatures is provided. The method includes providing an extended bond pad over an original die pad of an extracted die to create a modified extracted die. The extracted die is a fully functional semiconductor die that has been removed from a finished packaged integrated circuit. The method further includes placing the modified extracted die into a cavity of a package base, bonding a new bond wire between the extended bond pad and a lead of the package base or a downbond, and sealing a package lid to the package base.

In accordance with another embodiment of the present invention, a packaged integrated circuit for operating reliably at elevated temperatures is provided. The packaged integrated circuit includes a modified extracted die, where the modified extracted die has one or more extended bond pads. The packaged integrated circuit also includes a package comprising a base and a lid, and a plurality of new bond wires. The modified extracted die is placed into a cavity of the base. After the modified extracted die is placed into the cavity, the plurality of new bond wires are bonded between the one or more extended bond pads of the modified extracted die and package leads of the package base or downbonds. After bonding the plurality of new bond wires, the lid is sealed to the base.

In accordance with a further embodiment of the present invention, a packaged integrated circuit for operating reliably at elevated temperatures is provided. The packaged integrated circuit includes a modified extracted die. The modified extracted die includes one or more extended bond pads. Each of the one or more extended bond pads covers an original die pad of an extracted die. A 3D printer applies the one or more extended bond pads to the extracted die, the one or more extended bond pads includes a conductive material suitable for use as a die pad. The packaged integrated circuit also includes a package comprising a base and a lid and a plurality of new bond wires. The modified extracted die is placed into a cavity of the base. After the modified extracted die is placed into the cavity, the plurality of new bond wires are bonded between the one or more extended bond pads of the modified extracted die and package leads of the package base or downbonds. After bonding the plurality of new bond wires, the lid is sealed to the base.

An advantage of the present invention is that it provides a method for packaging an extracted die that works reliably at extended ambient temperatures. Conventional commercial grade packaging methods have not been proven to produce integrated circuit components that work reliably above 150° C. due to Kirkendall or Horsting voiding, which generates a brittle, non-conductive interface between the original gold ball bond and the aluminum pad. The present invention produces superior component reliability by virtually eliminating Kirkendall or Horsting voiding. That is, reliable package/die bond connections do not depend on the presence or integrity of previously existing ball bonds.

Yet another advantage of the present invention is it provides high temperature-tolerant packaged integrated circuits without requiring new bare dice. Often, new bare dice are not available due to integrated circuit obsolescence, the original manufacturer or fab is out of production, or the dice manufacturer is only selling packaged integrated circuits. By using extracted dice as the source, as long as the dice are available in some package, they may then be re-used in a high-temperature hermetic package.

An additional advantage of the present invention is that it allows an existing component to be repackaged into virtually any possible package and reused. Sometimes, the only available components are packaged in commercial plastic packages, but the user's application requires a specific different package. As long as the specific different package is available, the die in the original commercial package may be repackaged in the specific different package.

Yet another advantage of the present invention is it does not depend on the quality or integrity of existing ball bonds on an extracted die. The present invention creates new extended bond pads over the top of existing die pads and ball bonds. Therefore, contact is established to areas of existing die pads not covered by existing ball bonds. Even if the existing ball bonds have intermetallic weaknesses with the existing die pads, strong connections are still made to the original die pads.

Another advantage of the present invention is it provides variable geometry extended bond pads, which provide greater pad-to-pad spacing than the original bond pads of the extracted die. This has the advantage of providing greater spacing between new ball bonds, thereby reducing the change of a short between ball bonds during bonding.

Additional features and advantages of embodiments of the present invention will become more readily apparent from the following description, particularly when taken together with the accompanying drawings.

BRIEF DESCRIPTION OF THE DRAWINGS

FIG. 1 is a diagram illustrating an extracted die with bond pads and ball bonds in accordance with embodiments of the present invention.

FIG. 2a is a diagram illustrating an extended bond pad first geometry in accordance with embodiments of the present invention.

FIG. 2b is a diagram illustrating an extended bond pad second geometry in accordance with embodiments of the present invention.

FIG. 2c is a diagram illustrating an extended bond pad third geometry in accordance with embodiments of the present invention.

FIG. 3 is an illustration depicting a modified extracted die with extended bond pads of the second geometry in accordance with embodiments of the present invention.

FIG. 4 is an illustration depicting a modified extracted die with extended bond pads of the third geometry in accordance with embodiments of the present invention.

FIG. 5 is an illustration depicting a re-bonded extracted die with new ball bonds and new bond wires in accordance with embodiments of the present invention.

FIG. 6a is an illustration depicting extracted die section A-A in accordance with embodiments of the present invention.

FIG. 6b is an illustration depicting modified extracted die section B-B after a conformal coat process in accordance with embodiments of the present invention.

FIG. 6c is an illustration depicting rebonded extracted die section C-C after a re-bonding process in accordance with embodiments of the present invention.

FIG. 7a is an illustration depicting a first embodiment of a conformal coat stack-up of the present invention.

FIG. 7b is an illustration depicting a second embodiment of a conformal coat stack-up of the present invention.

FIG. 7c is an illustration depicting a third embodiment of a conformal coat stack-up of the present invention.

FIG. 8a is an illustration depicting components of an assembled package base in accordance with the present invention.

FIG. 8b is an illustration depicting components of a repackaged environmentally hardened integrated circuit in accordance with the present invention.

FIG. 9 is an illustration depicting 3D printing an extended bond pad in accordance with embodiments of the present invention.

FIG. 10 is a flowchart illustrating an assembly method for repackaging an environmentally hardened integrated circuit in accordance with a first embodiment of the present invention.

FIG. 11 is a flowchart illustrating an assembly method for repackaging an environmentally hardened integrated circuit in accordance with a second embodiment of the present invention.

FIG. 12 is a flowchart illustrating a first vacuum bake process in accordance with embodiments of the present invention.

FIG. 13 is a flowchart illustrating a second vacuum bake process in accordance with embodiments of the present invention.

DETAILED DESCRIPTION

Many operating environments require integrated circuit components capable of functioning reliably at extended temperatures. Some of these high-temperature environments include applications for engine controls, down-hole drilling, and foundry manufacturing operations to produce metal castings. Engine controls are often located in close proximity to an internal combustion, gas turbine, or jet engine, and are sometimes located on the engine side of a firewall. Down-hole drilling requires a wide variety of sensors, control components, and communication components operating in close proximity to a drill. In addition to heat generated by the drill itself, drilling far below the Earth's crust can reach operating environment temperatures of greater than 200° C. due to geothermal heat. Foundry metal casting operations require sensors and control components operating in close proximity to molten metal.

Although military grade integrated circuits are often desirable for extended high temperature environments, in many cases the environments themselves experience higher temperatures than the military grade integrated circuit temperature rating. For example, down-hole drilling environments sometimes reach temperatures of 250+° C., while military-grade integrated circuits commonly have a −55° C. to 125° C. operating temperature range. Another problem is the required integrated circuits may not be available in packages that can reliably withstand these temperature extremes. Required integrated circuits are sometimes out of production, and it is typically prohibitively expensive to procure new integrated circuits in suitable packaging. Therefore, what is needed is a method for modifying existing integrated circuits in order to work reliably at extended temperature operating environments.

Integrated circuits are most commonly packaged using dice with Aluminum (Al) bond pads and Gold (Au) bond wires from the bond pads to the package leads and package cavity. Since bare dice are generally not available, it is highly desirable to obtain dice from already packaged integrated circuits. Integrated circuit dice are then extracted from an existing package—usually plastic—and repackaged into a suitable hermetic package according to the methods of the present invention. These extracted dice retain the original Au ball bonds on the Al die pads.

Several known failure mechanisms can develop with Au—Al metallic interfaces. A brief overview is discussed in Wikipedias "Gold-aluminum intermetallic", which can be found at: http://en.wikipedia.org/wiki/Gold-aluminium intermetallic. A more in-depth discussion of Gold (Au)-Aluminum (Al) intermetallics can be found in "Wire Bonding in Microelectronics", Third Edition, by George Harman—published in 2010 by McGraw-Hill, ISBN P/N 978-0-07-170101-3 and CD P/N 978-0-07-170334-5 of set 978-0-07-147623-2. Specifically, the Harman reference discusses Au—Al intermetallic compounds in Chapter 5 pages 131-153, thermal degradation in Au ball bonds on Al bond pads in Appendix 5B pages 170-173, and wire bonds in extreme temperature environments in Chapter 9 pages 330-335.

Approximately 95% of all integrated circuits utilize Au ball bonds on Al bond pads, and are plastic encapsulated. There are five Au—Al intermetallic compounds: $Au_5Al_2$, $Au_4Al$, $Au_2Al$, $AuAl_2$, and AuAl. Gold-Aluminum intermetallic compound formation and associated Kirkendall voids have resulted in more documented wire-bond failures than any other integrated circuit problem over the years. The $AuAl_2$ intermetallic compounds are typically referred to as "purple plague", reflecting the characteristic color that often occurs around the perimeter of an Au bond on an Al pad. The compounds grow during the curing of plastic molding compounds (typically 175° C. for 3 to 5 hours) and grow during qualification screening, burn in, stabilization bakes, or cumulatively at any time when high temperatures (above 150° C.) are encountered during the life of the device.

Bond failures result from the formation of Kirkendall voids, as well as from the susceptibility of Au—Al bonds to degradation by impurities or corrosion. Kirkendall voids form when either the Al or Au diffuses out of one region faster than it diffuses in from the other side of that region. Vacancies pile up and condense to form voids, normally on the Au-rich side. Classical Kirkendall voids require bake times greater than an hour at temperatures greater than 300° C. to occur on the Au-rich side and greater than 400° C. on the Al-rich side, or much longer times at lower temperatures. It has been observed that Kirkendall voids may form more quickly over time at elevated temperatures in packaged integrated circuits in the presence of impurities, halides, and/or moisture around the Au—Al bonds. Halides present in plastic packages contribute to significantly faster formation of Kirkendall voids relative to that of hermetic packages. In plastic packages, moisture will easily travel through the plastic package and reach the die surface, mixing with present halides and causing the IC to prematurely fail. Therefore, what is needed is a process to repackage integrated circuits in such a way as to discourage the formation of Kirkendall voids and other forms of intermetallic bond weakness at elevated temperatures, and also to work reliably even in the presence of the formation of Kirkendall voids between original die pads and original ball bonds.

The well-known Arrhenius equation provides an accurate formula for predicting the rate of a chemical reaction based on temperature, and, with typical activation energies, can be generalized to state a reaction rate that roughly doubles for every 10-15 degrees Celsius increase in temperature. Therefore, it can be expected that the rate of Kirkendall void formation doubles for every 10-15 degrees Celsius increase in temperature. For example, this means that at a temperature of 200° C., Kirkendall voids can form on average 32 times faster than at 150° C. Increasingly high temperatures significantly reduce component lifetime based in accelerated growth of intermetallic weaknesses.

Previous repackaging processes sometimes utilized techniques involving stacked ball bonds, where a new ball bond was added on top of an existing ball bond. Such techniques generally work well, and represent a considerable environmental hardening when repackaged into a suitable hermetic package. However, these techniques are still dependent on the quality of original ball bonds on the extracted dice. In some cases, the original ball bonds already have various intermetallic bond weaknesses, possibly due to the presence of moisture and/or halides in the presence of the original bonds, as well as any history of high-temperature exposure. These intermetallic bond weaknesses may have manifestations in Kirkendall voids, purple plaque, or other known degradations.

Adding a new ball bond atop an existing ball bond also has limitations based on die pad pitch—the center-to-center distance between die pads. When a new ball bond is created atop an existing ball bond, thermosonic bonding processes soften the original ball bond with high temperatures and apply pressure to the original ball bond, thus flattening and "squishing out" the original ball bond. Where the die pad pitch is less than 80-85 microns, this may cause the original ball bond to come in contact with a different ball bond on an adjacent die pad, resulting in shorted connections.

The present invention is directed to the problem of repackaging integrated circuit dice into hermetic packages able to work reliably at high temperature extremes. Once a die has been extracted from an existing integrated circuit package (also described herein as a finished packaged integrated circuit or a different packaged integrated circuit), gold ball bonds still remain on the die bond pads.

The new package may be the same footprint type from which the die was originally extracted, or it may be an entirely different depending on the new requirements. However, in all cases the new package must be able to be hermetically sealed for optimum lifetime at elevated temperatures. A hermetically sealed integrated circuit is an airtight and moisture-tight integrated circuit. Integrated circuit hermeticity is specified in MIL-SPEC-883H "Department of Defense Test Method Standards Microcircuits". Hermetically sealed packages in current technology require a ceramic or metal lid and base. However, it is possible in the future that hermetically sealed packages may use a lid and base fabricated from a material other than ceramic or metal, and the present invention therefore applies to any such hermetic package material.

Referring now to FIG. 1, a diagram illustrating an extracted die 100 with bond pads and ball bonds in accordance with embodiments of the present invention is shown. Extracted die 100 is an individual semiconductor die or substrate, and is usually fabricated in suitable technologies including Silicon (Si) and Gallium Arsenide (GaAs). Extracted die 100 may have a single die or multiple interconnected dice. Regardless whether extracted die 100 includes a single die or multiple interconnected dice, die circuitry is connected to original die pads 104 of the extracted die 100. Original die pads 104 are aluminum (Al) or copper (Cu) alloy pads. Each previously used original die pad 104 of the extracted die 100 may have a single original gold ball bond 108 present, although some un-bonded die pads 112 may not have an original ball bond 108 present. In some cases, this is due to a no-connect in the previous package. When the extracted die 100 was present in whatever previous package was used for the extracted die 100, bond wires connected each of the original ball bonds 108 to a lead or a downbond of the previous package. FIG. 1 shows the extracted die 100, after it has been removed from the previous package. Therefore, bond wires have been removed and only original ball bonds 108 remain. In current technology packaged integrated circuits, the vast majority of bond wire interconnections are made with Au thermosonic ball bonding. Extracted dice 100 are in the state shown in FIG. 1 at the beginning of the process of the present invention. Section A-A is used in FIG. 6a to illustrate a side view of extracted die 100.

Referring now to FIG. 2a, a diagram illustrating an extended bond pad first geometry 204 in accordance with embodiments of the present invention is shown. The process of the present invention adds a conductive conformal coating to selected areas of extracted die 100. Prior to the conformal coating being applied, FIG. 2a illustrates an original die pad 104 with an original ball bond 108. In many cases, the original die pad 104 is aluminum (Al) and the original ball bond 108 is gold (Au). Applying the conformal coating over the top of the original die pad 104 and original ball bond 108 creates an extended bond pad of a first geometry 204. In the embodiment illustrated in FIG. 2a, the extended bond pad 204 is same size or slightly larger than the original die pad 104, and the conformal coating covers the original ball bond 108, if an original ball bond 108 is present. Conformal coating is any material suitable for use as an extended bond pad on an extracted die 100 that readily bonds to original die pad 104 material, usually aluminum, and is able to withstand temperatures up to 250° C. In a preferred embodiment, the conformal coating material includes a solvent, a binder, and silver nanoparticles. Conformal coating material used in 3D printing technologies is typically an aerosol in order to form extended bond pads 204, 208, 220 with consistent thickness and tight tolerances in all deposited areas.

The embodiment illustrated in FIG. 2a is the preferred embodiment of the present invention since a minimal amount of conformal coating material is required, and the extended bond pad 204 does not require more space of extracted die 100 than is already provided for original die pads 104.

Referring now to FIG. 2b, a diagram illustrating an extended bond pad second geometry 208 in accordance with embodiments of the present invention is shown. The original die pad 104 and original ball bond 108 are the same as FIG. 2a prior to conformal coat being applied. The second extended bond pad geometry creates an extended bond pad 208 with a larger surface area than the first extended bond pad geometry 204 of FIG. 2a. The extended bond pad 208 includes a first portion of extended bond pad 212, and a second portion of extended bond pad 216.

The first portion of extended bond pad 212 covers the original die pad 104 and an original ball bond 108, if an original ball bond 108 is present. The second portion of extended bond pad 216 covers other areas of extracted die 100 separate from existing original die pads 104. In general, the thickness of conformal coat applied over first portion of extended bond pad 212 is less thick than the second portion of extended bond pad 216. However, the first portion of extended bond pad 212 and second portion of extended bond pad 216 are in electrical connection at all times.

The extended bond pad second geometry 208 provides the second portion of extended bond pad 216 a surface upon which a new ball bond 504 may be placed. The second geometry extended bond pad 208 is preferable to the first geometry extended bond pad 204 in cases where it may be desirable to place a larger new ball bond 504 on the re-bonded extracted die 500. However, the second geometry extended bond pad 208 requires more conformal coat material than the first geometry extended bond pad 204, and may take longer to fabricate than a re-bonded extracted die 500 using extended bond pads of the first geometry 204.

Referring now to FIG. 2c, a diagram illustrating an extended bond pad third geometry 220 in accordance with embodiments of the present invention is shown. The original die pad 104 and original ball bond 108 are the same as FIG. 2a prior to conformal coat being applied. The third extended bond pad geometry creates an extended bond pad 220 with a larger surface area than the first extended bond pad geometry of FIG. 2a. The extended bond pad 220 includes at least one narrow portion 224 and wide portion 228, although there may be more than one of each narrow portion 224 and wide portion 228 of a single extended bond pad 220.

The extended bond pad third geometry 220 provides a wide portion 228 as a surface, upon which a new ball bond 504 may be placed. The third geometry extended bond pad 220 is preferable to the first geometry extended bond pad 204 and the second geometry creates an extended bond pad 208 in cases where it may be desirable to place a larger new ball bond 504 in a difficult to reach location on modified extracted die 400. However, the third geometry extended bond pad 220 requires more conformal coat material than the first geometry extended bond pad 204, and may require more conformal coat and take longer to fabricate than a modified extracted die 300 using extended bond pads of the second geometry 208.

Referring now to FIG. 3, an illustration depicting a modified extracted die 300 with extended bond pads 208 of the second geometry in accordance with embodiments of the present invention is shown.

Modified extracted die 300 is an extracted die 100 after conformal coat has been applied. Modified extracted die 300 includes a plurality of extended bond pads 208, which are extended bond pads of the second geometry. Beneath the conformal coating, modified extracted die 300 includes original die pads 104 and original ball bonds 108. The conformal coating covers each of the original die pads 104, and original ball bonds 108, if present. Each extended bond pad 208 includes a first portion of extended bond pad 212, and a second portion of extended bond pad 216. In some embodiments, the thickness of conformal coating over the first portion of extended bond pad 212 is less than the thickness of conformal coating over the second portion of extended bond pad 216. Section B-B illustrates a side view of modified extracted die 300 in FIG. 6b.

Referring now to FIG. 4, an illustration depicting a modified extracted die 400 with extended bond pads of the third geometry 220 in accordance with embodiments of the present invention is shown.

Extended bond pads of the third geometry 220 include at least one narrow portion 224, and at least one wide portion 228. In some embodiments, extended bond pads 220 include one narrow portion 224, and one wide portion 228. In other embodiments, extended bond pads 220 include multiple narrow portions 224, and multiple wide portions 228. FIG. 4 illustrates exemplary arrangements of extended bond pads 220, based on hypothetical proximity to other circuits or communication paths on extracted die 100.

Modified extracted die 400 is an extracted die 100 after conformal coating has been applied. Modified extracted die 400 includes a plurality of extended bond pads 220, which are extended bond pads of the third geometry. Beneath the conformal coating, modified extracted die 400 includes original die pads 104 and original ball bonds 108. The conformal coating covers each of the original die pads 104, and original ball bonds 108, if present. Each extended bond pad 220 includes a first portion of extended bond pad 212, and a second portion of extended bond pad 216. In some embodiments, the thickness of conformal coating over the first portion of extended bond pad 212 is less than the thickness of conformal coating over the second portion of extended bond pad 216. Section B-B illustrates a side view of modified extracted die 400 in FIG. 6b.

Although FIGS. 3 and 4 illustrate extended bond pads 208, with 220 of a specific geometry, it should be noted that for any modified extracted die 300, 400 may include any combination of extended bond pads 204, 208, 220 in any arrangement or quantity. The present invention includes embodiments with any arrangement of extended bond pads beyond those explicitly illustrated herein, and embodiments include multiple extended bond pad geometries deposited on the same extracted die 100. For example, irregular bond pads with an elliptical, circular, or curvilinear arrangement are contemplated by the present invention.

Referring now to FIG. 5, an illustration depicting a rebonded extracted die 500 with new ball bonds 504 and new bond wires 508 in accordance with embodiments of the present invention is shown. FIG. 5 illustrates a modified extracted die 300, with 400 representing a case after new ball bonds and bond wires have been attached. Although rebonded extracted die 500 is illustrated with extended bond pads 208 as 220, it should be noted that any form of extended bond pad may be used with re-bonded extracted die 500, including extended bond pads the first geometry 204 and other geometries of extended bond pads not specifically illustrated herein.

After applying the conformal coating to the extracted die 100, a modified extracted die 300, 400 is created. Once the rebonded extracted die 500 is placed into a package base 804, as described with reference to FIG. 8a, new ball bonds 504 and new bond wires 508 are bonded to extended bond pads 204, 208, and 220.

In the assembly process of the present invention, a new bond wire 508 is bonded to the extended bond pad 204, 208, and 220 with a new ball bond 504. The new bond wire 508 meets the bond pull strength requirements of MIL-STD-883H, and can be either gold, aluminum, or copper. The selected bond wire type will be dependent on the new pad material to optimize bond lifetime at elevated temperatures. Therefore, the new bond can either be a ball or a wedge. The new ball bond 504 is thermosonically welded to the extended bond pad 204, 208, and 220 using thermosonic welding techniques well known in the art.

In thermosonic welding, the interface temperature is typically between 125° C. and 220° C. For gold ball bonding, the gold bond wire 508 is threaded through a capillary-shaped tool, and a spark melts the end of the wire forming a ball at the bottom of the tool. The bond (weld) is formed when the tool under load presses or deforms the ball against the heated extended bond pad 204, 208, and 220, with ultrasonic energy applied, thereby completing the process. Original ball bonds 108 are usually attached to original die pads 104 using a thermosonic welding process. For other types of wire and/or bond pads, appropriate bonding processes known in the art are used.

Referring now to FIG. 6a, an illustration depicting extracted die 100 section A-A in accordance with embodiments of the present invention is shown. Extracted die 100 includes a die substrate 604, and the passivation layer 608 built atop the die substrate 604. Aluminum (Al) die pads 104a, 104b are shown in FIG. 6a, with an original ball bond 108 only on Al die pad 104a. Many extracted dice 100 will not have original ball bonds 108 on every original die pad 104, such as in the case once when some original die pads 104 are no connects. FIG. 6a illustrates the extracted die 100, before conformal coating, new ball bonds 504, and new bond wires 508 are applied.

Referring now to FIG. 6b, an illustration depicting modified extracted die 300, 400 section B-B after a conformal coat process in accordance with embodiments of the present invention is shown. As discussed previously with respect to FIGS. 3 and 4, the modified extracted die 300, 400 is an extracted die 100 after conformal coating has been applied.

When extended bond pads of the second geometry 208 are utilized, the first portion of extended bond pad 212 covers the original die pad 104, as well as the original ball bond 108, if present. The second portion of extended bond pad 216 extends away from the first portion of extended bond pad 212, and provides a surface upon which a new ball bond 504 may be attached.

In the conformal coating process of FIG. 6b, a first conformal coat thickness 612 is applied over the original die pad 104 and original ball bond 108, if present. A second conformal coat thickness 616 is applied over portions of extended bond pad 204, 208, 220 corresponding to the second portion of extended bond pad 216. In one embodiment, the first conformal coat thickness 612 is greater than the second conformal coat thickness 616. In a second embodiment, the first conformal coat thickness 612 is similar to the second conformal coat thickness 616.

In a third and preferred embodiment, the conformal coat thickness at the location where new ball bonds 504 are to be placed may be any thickness, but is preferably at least 2 microns, and the conformal coat thickness at locations where new ball bonds 504 will not be placed is preferably 0.5-1 micron. For embodiments using extended bond pads of the first geometry 204 where a new ball bond 504 will be placed over the original ball bond 108 (with conformal coat material between the original ball bond 108 and the new ball bond 504), the first conformal coat thickness 612 may be any thickness, but is preferably at least 2 microns. For embodiments using extended bond pads of the second 208 or third geometries 220 where a new ball bond 504 will be placed over the second portion of extended bond pad 216, the second conformal coat thickness 616 may be any thickness, but is preferably at least 2 microns. For embodiments using extended bond pads of any geometry 204, 208, and 220 where no new ball bond 504 is required, the first 612 and second 616 conformal coat thickness can be less than 2 microns and is preferably 0.5-1 micron. This third embodiment is useful since a thicker application of conformal coating helps to protect against cracking of the incompressible passivation layer 608 and/or die substrate 604, upon exposure to subsequent bonding efforts.

Referring now to FIG. 6c, an illustration depicting rebonded extracted die 500 section C-C after a re-bonding process in accordance with embodiments of the present invention is shown.

In FIG. 6c, new ball bonds 504 and new bond wires 508 are applied to extended bond pads 204, 208, and 220. Although two new ball bonds 504 and new bond wires 508 are illustrated in FIG. 6c, it should be understood that in some embodiments, no new ball bonds 504 and new bond wires 508 may be provided for every extended bond pad 204, 208, and 220.

For extended bond pads of the second or third geometry (as shown) 208, 220, new ball bonds 504 are provided to the second portion of extended bond pad 216. For extended bond pads of the first geometry 204, new ball bonds 504 are provided to the first portion of extended bond pad 212. Where an original ball bond 108 is present beneath the conformal coat, the new ball bond 504 will be provided directly on top of the conformal coat and original ball bond 108.

Referring now to FIG. 7a, an illustration depicting a first embodiment of a conformal coat stack-up of the present invention is shown. The first embodiment conformal coat stack-up illustrates a rebonded extracted die 500 having only a conformal coat first layer 704. The first embodiment may be used where an extended bond pad 204, 208, and 220 has a compatible metallurgy as original die pad 104. Therefore, when the original die pad 104 is aluminum (Al) in the original ball bond is gold (Au), it is advantageous to provide a silver nanoparticle extended bond pad 204, 208, and 220 as the conformal coat first layer 704.

Referring now to FIG. 7b, an illustration depicting a second embodiment of a conformal coat stack-up of the present invention is shown. The second embodiment conformal coat stack-up illustrates a rebonded extracted die 500 having both a conformal coat first layer 704 and a conformal coat second layer 708.

In some embodiments, a conformal coat first layer 704 and conformal coat second layer 708 are applied in order to build up the total conformal coat thickness to meet a minimum or desired thickness. Such an approach typically uses the same type of material for both conformal coat layers 704, 708, and may be required if the 3D printing apparatus can only apply the conformal coating in a limited thickness that may not support thermosonic bonding of new ball bonds 504 without risking cracking the die substrate 604 or passivation layer 608 with subsequent bonding efforts.

In other embodiments, the conformal coat first layer 704 and conformal coat second layer 708 are different materials. Such an approach may be required based on desired intermetallic interfaces between the original die pad 104, original ball bond 108, first conformal coat layer 704, second conformal coat layer 708, and new ball bonds 504. For example, the first conformal coat layer 704 may be silver nanoparticles and the second conformal coat layer may be aluminum.

Referring now to FIG. 7c, an illustration depicting a third embodiment of a conformal coat stack-up of the present invention is shown. The third embodiment conformal coat stack-up illustrates a rebonded extracted die 500 having a conformal coat first layer 704, a conformal coat second layer 708, and a conformal coat third layer 712.

The third embodiment of conformal coat stack-up illustrated in FIG. 7c may be used for the desired thickness and desired intermetallic compatibility discussed with respect to FIG. 7b. Additionally, it should be understood that the present invention includes any number of layers, thicknesses, or materials for conformal coat applied to an extracted die 100.

Referring now to FIG. 8a, a block diagram illustrating components of an assembled package base 800 in accordance with the present invention is shown. The assembled package base 800 is an intermediate assembly of the repackaged environmentally hardened integrated circuit 820 illustrated in FIG. 8b.

The assembled package base 800 includes a package base 804. In one embodiment, the package base 804 is a non-hermetic package base. In a preferred embodiment, the package base 804 is a hermetic package base. If the package base 804 is a hermetic package base, it may be formed from ceramic, metal, or glass materials. The package base 804 includes a cavity 808 into which a rebonded die 500 is placed.

Die attach adhesive 812 is applied to the package base 804 such that when the rebonded die 500 is inserted into the package base cavity 808, the die attach adhesive 812 makes simultaneous contact with both the package base 804 and the rebonded die 500. Die attach adhesive 812 is a low-halide compound adhesive, where a low halide compound has less than 10 parts per million (ppm) halide. Die attach adhesive 812 therefore bonds the rebonded die 500 to the package base 804, and protects the integrity of the interior of the repackaged environmentally hardened integrated circuit 820. It has been well established that halogens in an Au—Al bond interface degrade Au—Al bond strength since out gassed products from adhesives containing halogens rapidly corrode Al metallization in integrated circuits at high temperatures, thus reducing product lifetime at high temperatures.

Associated with the package base 804 are a series of package leads 816, which provide interconnection between circuitry of the rebonded die 500 and circuitry of a printed circuit board on which the repackaged environmentally hardened integrated circuit 820 is eventually mounted. For example, if an SO-24 ceramic package is used for the repackaged environmentally hardened integrated circuit 820, 24 package leads 816 would be present, configured as 12 package leads 816 on each of two opposite sides of the package base 804. If a PLCC-68 ceramic package is used for the repackaged environmentally hardened integrated circuit 820, 68 package leads 816 would be present, configured as 17 package leads 816 on each of the four sides of the package base 804.

After mounting the rebonded die 500 into the package base 804 using die attach adhesive 812, new bond wires 508 are then attached by thermosonic welding from extended bond pads 204, 208, 220 of rebonded die 500 to package leads 816. Thermosonic welding utilizes ultrasonic and thermal energy to provide strong bonds between new bond wires 508 and extended bond pads 204, 208, 220 and package leads 816. New bond wires 508 are commonly 1-3 mils in diameter, but may be any usable diameter. A new ball bond 504 is formed on top of extended bond pads 204, 208, and 220, as required. In a preferred embodiment, new bond wires 508 are Gold (Au) bond wires. In other embodiments, new bond wires 508 are Aluminum (Al) or Copper (Cu) bond wires.

Once all new bond wires 508 are bonded between package leads 816 and extended bond pads 204, 208, and 220 or downbonds to the package cavity 808, the assembled package base 800 including rebonded die 500, die attach adhesive 812, package base 804, package leads 816, and new bond wires 508, is first vacuum baked according to the process of FIG. 12.

Referring now to FIG. 8b, a block diagram illustrating components of a repackaged environmentally hardened integrated circuit 820 in accordance with the present invention is shown. Repackaged environmentally hardened integrated circuit 820 includes the assembled package base 800 of FIG. 8a and additional components described below.

Following the first vacuum bake process of FIG. 12, a package lid 824 is attached to the assembled package base 800. In one embodiment, the package lid 824 is a non-hermetic package lid. In a preferred embodiment, the package lid 824 is a hermetic package lid. If the package lid 824 is a hermetic package lid, it may be formed from ceramic, metal, or glass materials.

A moisture getter 832 is present within the repackaged environmentally hardened integrated circuit 820. The moisture getter 832 is a compound that absorbs moisture within the repackaged environmentally hardened integrated circuit 820 after the package has been hermetically sealed. By absorbing moisture that rapidly weakens Au—Al bonds at temperatures over 175° C., the predominant high temperature failure mechanism is minimized within the repackaged environmentally hardened integrated circuit 820. An example of a moisture getter 832 is Cookson Group STAY-DRY® SD1000, which is a paste formulation high-temperature moisture getter 832 intended for high reliability applications. In a preferred embodiment, moisture getter 832 is applied to the interior surface of the package lid 824 using a deposition process, where uniform thickness of three or more microns of moisture getter 832 is applied.

A sealing material 828 is present between the assembled package base 800 and the package lid 824 to produce a hermetic seal at the end of a second vacuum bake process. The second vacuum bake process is illustrated in FIG. 13. In a preferred embodiment, sealing material 828 is applied to the package lid 824 prior to attaching the package lid 824 to the assembled package base 800. In one embodiment, the sealing material 828 is sealing glass. In another embodiment, the sealing material 828 is an epoxy. In a third embodiment, the sealing material 828 is a solder compound.

In conjunction with the second vacuum bake process of FIG. 13, a noble gas 836 is injected into the interior of the repackaged environmentally hardened integrated circuit 820. Noble gas 836 injection occurs prior to sealing the package lid 824 to the assembled package base 800, but during the second vacuum bake process. In a preferred embodiment, noble gas 836 is Argon. In other embodiments, noble gas 836 includes any one of Helium (He), Neon (Ne), Krypton (Kr), Xenon (Xe), and Radon (Rn). Noble gases 836 pressurize the repackaged environmentally hardened integrated circuit 820 such that over temperatures of −55° C. to 250° C., the internal pressure of the repackaged environmentally hardened integrated circuit 820 is maintained between 0.1 ATM and 2 ATM, preferably 1 ATM. This minimizes pressure-caused stress to the repackaged environmentally hardened integrated circuit 820, and especially stress to the sealing material 828. Noble gases 836 are used in preference to other gases since noble gases 836 are inert and do not react with the moisture getter 832. In a preferred embodiment, the noble gas 836 is injected into the cavity to a pressure of between 0.1 to 2 Atmospheres (ATM), preferably 1 ATM, at a temperature between 200° C. and 275° C., preferably 255° C.

Referring now to FIG. 9, an illustration depicting 3D printing an extended bond pad 204, 208, and 220 in accordance with embodiments of the present invention is shown. 3D printers are able to create extended bond pads 204, 208, 220, and are preferable to conventional processes using sputter deposition, including masking steps. For example, a first masking step is for areas of the extracted die 100 that do not receive deposited materials, and a second masking step assists in the subsequent etching of any undesired deposition after sputtering.

An extracted die 100 is placed within a suitable fixture of a 3D printer. The extracted die 100 is cleaned or prepared in whatever fashion is recommended in order for the extended bond pad 204, 208, 222 to permanently adhere to the extracted die 100.

Next, a 3D printer conductive material spray head 908 sprays a conductive material 904 onto the extracted die 100. In a preferred embodiment, the conductive material 904 sprayed includes silver nanoparticles. In other embodiments, the conductive material 904 sprayed includes other conformal coating materials suitable for extended bond pads 204, 208, 220. A drawing or software file used in conjunction with the 3D printer directs the 3D printer conductive material spray head 908.

In some embodiments, the 3D printer first injects a conductive material 904 spray or aerosol into proximity to the extracted die 100, and then directs a laser or ion beam to specifically cure extended bond pad 204, 208, 220 locations to form extended bond pads 204, 208, 220 at the desired locations, geometries, and thicknesses. Once all extended bond pads 204, 208, and 220 have been created, the extracted die 100 is now a modified extracted die 300, 400. In order to provide suitable spacing between extended bond pads 204, 208, and 220, the laser or ion beam is deactivated after completing each extracted bond pad 204, 208, and 220 and is activated before a next extended bond pad 204, 208, and 220 is created. As long as conductive material 904 can be accurately deposited directly by the spray head 908 on the extracted die 100, directly depositing the conductive material 904 is preferred over methods that first inject a conductive material 904 spray or aerosol, followed by laser/ion curing, due to speed of application.

Extended bond pads 204, 208, and 220 may be created in a single pass of the 3D printer conductive material spray head 908 or laser/ion beam, or in multiple passes. In one embodiment, the conductive material 904 is the same for each pass. This embodiment is expected for the conformal coat stack-up of FIG. 7a, where only a conformal coat first layer 704 is present. In order to create different thicknesses of conformal coat material 612, 616 of FIG. 6, it may be necessary to have multiple passes of the 3D printer conductive material spray head 908 or laser/ion beam. For example, a first pass may deposit conductive material 904 on the first portion of extended bond pad 212, and a second pass may deposit conductive material 904 on both the first portion of extended bond pad 212 and the second portion of extended bond pad 216. Such an arrangement may, for example, be required to create a thicker second conformal coat thickness 616 than the first conformal coat thickness 612.

In another embodiment, the conductive material 904 may be different for different passes of the 3D printer conductive material spray head 908 or laser/ion beam.

Current 3D printing processes allow extended bond pads 204, 208, and 220 to be reliably formed with a pad pitch of about 80 microns or greater. However, in the future printer and process improvements are expected that can reduce the extended bond pad pitch to less than 80 microns. An advantage of using 3D printing processes over conventional Redistribution Layers (RDLs) is that masks are not required to indicate to the printer where to avoid placing the RDL. Therefore, 3D printing may be faster and therefore cheaper than a sputtered RDL process.

Referring now to FIG. 10, a flowchart illustrating a first embodiment of an assembly method for a repackaged environmentally hardened integrated circuit 820 in accordance with the present invention is shown. Flow begins at block 1004.

At block 1004, a redistribution layer (RDL) including one or more extended bond pads 204, 208, and 220 is sputtered onto the extracted die 100 in order to create a modified extracted die 300, 400. RDLs require masking and etching steps in order to make the extended bond pads 204, 208, and 220 have the proper dimensions and positioning on the extracted die 100. Flow proceeds to block 1008.

At block 1008 the modified extracted die 300, 400 is placed into the package base cavity 808. Flow proceeds to block 1012.

At block 1012, the modified extracted die 300, 400 is bonded to the package base 804. In one embodiment, a low-halide content die attach adhesive is applied to the package base 804. The die attach adhesive acts as a glue between the extracted die 100 in the package base 804, thereby eliminating movement of the modified extracted die 300, 400 relative to the package base 804. Flow proceeds to block 1016.

At block 1016, a plurality of new bond wires 508 are bonded between extended bond pads 204, 208, and 220 of the modified extracted die 300, 400 and package leads 816 as well as downbonds as required. A bond map designates the specific connections to be provided by each of the plurality of new bond wires 508. Flow proceeds to block 1020.

At block 1020, the assembled package base 800 is first vacuum baked. The assembled package base 800 includes the package base 804, package leads 816, the modified extracted die 300, 400, the die attach adhesive 812, and the plurality of new bond wires 508. The process of first vacuum baking is illustrated in FIG. 12. Flow proceeds to block 1024.

At block 1024, the assembled package base 800 is removed from the vacuum baking apparatus and the package lid 824 is placed on the assembled package base 800. The package lid 824 is placed in proper orientation such that the combination of the package lid 824 and the assembled package base 800 is hermetically sealed following block 1040. A moisture getter 832 is applied to the interior of the package lid 824. In a preferred embodiment, the moisture getter 332 is uniformly applied with a thickness of three or more microns to the interior surface of the package lid 824 using a deposition process. Flow proceeds to block 1028.

At block 1028, the assembled package base 800 and package lid 824 are placed into the vacuum baking apparatus and second vacuum baked. Unlike block 1020, where only the package base 804 is first vacuum baked, block 1028 requires the package lid 824 to be placed on the assembled package base 800 prior to initiating the second vacuum bake process. The second vacuum bake process is illustrated in FIG. 13. Flow proceeds to block 1032.

At block 1032, a vacuum pump in the vacuum baking apparatus is turned off. Turning the vacuum pump off prevents gases from being evacuated from the vacuum baking apparatus, and is required in order for noble gas 836 injected in block 1036 to remain in the repackaged environmentally hardened integrated circuit 820 after the package lid 824 is sealed to the assembled package base 800. Flow proceeds to block 1036.

At block 1036, a noble gas 836 is injected into the repackaged environmentally hardened integrated circuit 820, while the repackaged environmentally hardened integrated circuit 820 is in the vacuum baking apparatus, and immediately following the second vacuum bake process. In a preferred embodiment, the noble gas 836 is Argon, and the noble gas 836 is injected into the cavity 808 to a pressure of between 0.1 to 2 Atmospheres (ATM), preferably 1 ATM, at a temperature between 200° C. and 275° C., preferably 255° C. Flow proceeds to block 1040.

At block 1040, the package lid 824 is sealed to the assembled package base 800 to create a repackaged environmentally hardened integrated circuit 820. A sealing material 828 known in the art between the package lid 824 and the package base 804 is activated at a specific temperature corresponding to the type of sealing material 828 used within the vacuum baking apparatus. Once sealing is completed, the noble gas 836 is present within the repackaged environmentally hardened integrated circuit 820 and is pressurized at the level specified in block 1036. Flow continues to block 1044.

At block 1044, the repackaged environmentally hardened integrated circuit 820 is removed from the vacuum baking apparatus and is tested for hermeticity per MIL-SPEC-883H. In one embodiment, flow proceeds to block 1052. In a second embodiment, flow proceeds to optional block 1048.

At optional block 1048, the package leads 816 are trimmed, if necessary. In some embodiments, the package leads 816 are already trimmed in the package base 804, and do not need to be trimmed. If the package leads 816 do need to be trimmed, they are trimmed per customer requirements. Flow proceeds to block 1052.

At block 1052, the repackaged environmentally hardened integrated circuit 820 is electrically tested. Electrical testing includes continuity tests or functional tests, or both. If the repackaged environmentally hardened integrated circuit 820 has passed the hermeticity and electrical tests, and the package leads 816 are properly trimmed, the repackaged environmentally hardened integrated circuit 820 is marked and is a complete environmentally hardened integrated circuit ready for use. Flow ends at block 1052.

Referring now to FIG. 11, a flowchart illustrating a second embodiment of an assembly method for a repackaged environmentally hardened integrated circuit 820 in accordance with the present invention is shown. Flow begins at block 1104.

At block 1104, a 3D printer prints one or more extended bond pads 204, 208, and 220 on the extracted die 100 in order to create a modified extracted die 300, 400. The 3D printing process is described in FIG. 9. Flow proceeds to block 1108.

At block 1108 the modified extracted die 300, 400 is placed into the package base cavity 808. Flow proceeds to block 1112.

At block 1112, the modified extracted die 300, 400 is bonded to the package base 804. In one embodiment, a low-halide content die attach adhesive is applied to the package base cavity 808. The die attach adhesive acts as a glue between the extracted die 100 in the package base 804, thereby eliminating movement of the modified extracted die 300, 400 relative to the package base 804. Flow proceeds to block 1116.

At block 1116, a plurality of new bond wires 508 are bonded between extended bond pads 204, 208, and 220 of the modified extracted die 300, 400 and package leads 816 as well as downbonds as required. A bond map designates the specific connections to be provided by each of the plurality of new bond wires 508. Flow proceeds to block 1120.

At block 1120, the assembled package base 800 is first vacuum baked. The assembled package base 800 includes the package base 804, package leads 816, the modified extracted die 300, 400, the die attach adhesive 812, and the plurality of new bond wires 508. The process of first vacuum baking is illustrated in FIG. 12. Flow proceeds to block 1124.

At block 1124, the assembled package base 800 is removed from the vacuum baking apparatus and the package lid 824 is placed on the assembled package base 800. The package lid 824 is placed in proper orientation such that the combination of the package lid 824 and the assembled package base 800 is hermetically sealed following block 1140. A moisture getter 832 is applied to the interior of the package lid 824. In a preferred embodiment, the moisture getter 332 is uniformly applied with a thickness of three or more microns to the interior surface of the package lid 824 using a deposition process. Flow proceeds to block 1128.

At block 1128, the assembled package base 800 and package lid 824 are placed into the vacuum baking apparatus and second vacuum baked. Unlike block 1120, where only the package base 804 is first vacuum baked, block 1128 requires the package lid 824 to be placed on the assembled package base 800 prior to initiating the second vacuum bake process. The second vacuum bake process is illustrated in FIG. 13. Flow proceeds to block 1132.

At block 1132, a vacuum pump in the vacuum baking apparatus is turned off. Turning the vacuum pump off prevents gases from being evacuated from the vacuum baking apparatus, and is required in order for noble gas 836 injected in block 1136 to remain in the repackaged environmentally hardened integrated circuit 820 after the package lid 824 is sealed to the assembled package base 800. Flow proceeds to block 1136.

At block 1136, a noble gas 836 is injected into the repackaged environmentally hardened integrated circuit 820, while the repackaged environmentally hardened integrated circuit 820 is in the vacuum baking apparatus, and immediately following the second vacuum bake process. In a preferred embodiment, the noble gas 836 is Argon, and the noble gas 836 is injected into the cavity 808 to a pressure of between 0.1 to 2 Atmospheres (ATM), preferably 1 ATM, at a temperature between 200° C. and 275° C., preferably 255° C. Flow proceeds to block 1140.

At block 1140, the package lid 824 is sealed to the assembled package base 800 to create a repackaged environmentally hardened integrated circuit 820. A sealing material 828 known in the art between the package lid 824 and the package base 804 is activated at a specific temperature corresponding to the type of sealing material 828 used within the vacuum baking apparatus. Once sealing is completed, the noble gas 836 is present within the repackaged environmentally hardened integrated circuit 820 and is pressurized at the level specified in block 1036. Flow continues to block 1144.

At block 1144, the repackaged environmentally hardened integrated circuit 820 is removed from the vacuum baking apparatus and is tested for hermeticity per MIL-SPEC-883H. In one embodiment, flow proceeds to block 1152. In a second embodiment, flow proceeds to optional block 1148.

At optional block 1148, the package leads 816 are trimmed, if necessary. In some embodiments, the package leads 816 are already trimmed in the package base 804, and do not need to be trimmed. If the package leads 816 do need to be trimmed, they are trimmed per customer requirements. Flow proceeds to block 1152.

At block 1152, the repackaged environmentally hardened integrated circuit 820 is electrically tested. Electrical testing includes either continuity tests or functional tests, or both. If the repackaged environmentally hardened integrated circuit 820 has passed the hermeticity and electrical tests and the package leads 816 are properly trimmed, the repackaged environmentally hardened integrated circuit 820 is marked and is a complete environmentally hardened integrated circuit ready for use. Flow ends at block 1152.

Referring now to FIG. 12, a flowchart illustrating a first vacuum bake process 1020, 1120 in accordance with embodiments of the present invention is shown. Flow begins at block 1204.

At block 1204, the assembled package base 800 is placed into a vacuum/pressure furnace. The vacuum/pressure furnace is equipment designed to present a predetermined thermal profile to one or more integrated circuits at a fixed or varying atmospheric pressure profile. Examples of vacuum/pressure furnaces are models 3130, 3140, and 3150 produced by Scientific Sealing Technologies International (SST). Flow proceeds to block 1208.

At block 1208, the internal temperature of the vacuum/pressure furnace is adjusted to a temperature of 200° C. or more. Flow proceeds to block 1212.

At block 1212, a baking timer is started. The baking timer measures elapsed time the assembled package base 800 is baking in the vacuum/pressure furnace. Flow proceeds to decision block 1216.

At decision block 1216, the baking timer is evaluated to determine if the assembled package base 800 has been baking for one half hour, or more. If the assembled package base 800 has not been baking for at least one half hour, then flow proceeds to decision block 1216 to wait until at least one half hour of baking time has elapsed. In a first embodiment, if the assembled package base 800 has been baking for at least one half hour, then flow proceeds to block 1224. In a second embodiment, if the assembled package base 800 has been baking for at least one half hour, then flow proceeds to optional decision block 1220.

At optional decision block 1220, the vacuum/pressure furnace is evaluated to determine if a baking pressure of 20 milliTorr (mTorr) or less has been reached. Vacuum/pressure furnaces reduce the baking pressure from atmospheric (i.e., 1 atm) to pressures which can be orders of magnitude less than atmospheric pressure. Initially, the pressure is reduced rapidly, and later on, the pressure slowly decreases. Therefore, the specified target pressure (20 mTorr) is usually reached near the end of the baking time. If a baking pressure of 20 mTorr or less has not been reached, the flow proceeds to block 1220 to wait until at least a baking pressure of 20 mTorr or less has been reached. If a baking pressure of 20 mTorr or less has been reached, the flow proceeds to block 1224.

At block 1224, the assembled package base 800 is removed from the vacuum/pressure furnace. The first vacuum baking process is now completed. Flow proceeds to blocks 1024 of FIG. 10 or block 1124 of FIG. 11.

Referring now to FIG. 13, a flowchart illustrating a second vacuum bake process 1028, 1128 in accordance with embodiments the present invention is shown. Although a second vacuum bake process may not always be required, it is performed in the preferred embodiment of the present invention. Flow begins at block 1304.

At block 1304, the assembled package base 800 and package lid 824 is placed into the vacuum/pressure furnace. Flow proceeds to block 1308.

At block 1308, the internal temperature of the vacuum/pressure furnace is adjusted to a temperature of 150° C. or more. Flow proceeds to block 1312.

At block 1312, a baking timer is started. The baking timer measures elapsed time the assembled package base 800 and package lid 824 is baking in the vacuum/pressure furnace. Flow proceeds to decision block 1316.

At decision block 1316, the baking timer is evaluated to determine if the assembled package base 800 and package lid 824 has been baking for one half hour, or more. If the assembled package base 800 and package lid 824 has not been baking for at least one half hour, then flow proceeds to decision block 1316 to wait until at least one half hour of baking time has elapsed. In one embodiment, if the assembled package base 800 and package lid 824 has been baking for at least one half hour, then flow proceeds to block 1032 of FIG. 10 and block 1132 of FIG. 11. In a second embodiment, if the assembled package base 800 and package lid 824 has been baking for at least one half hour, then flow proceeds to optional decision block 1320.

At optional decision block 1320, the vacuum/pressure furnace is evaluated to determine if a baking pressure of 20 milliTorr (mTorr) or less has been reached. Vacuum/pressure furnaces reduce the baking pressure from atmospheric (i.e., 1 atm) to pressures which can be orders of magnitude less than atmospheric pressure. Initially, the pressure is reduced rapidly, and later on, the pressure slowly decreases. Therefore, the specified target pressure (20 mTorr) is usually reached near the end of the baking time. If a baking pressure of 20 mTorr or less has not been reached, then flow proceeds to optional block 1320 to wait until at least a baking pressure of 20 mTorr or less has been reached. If a baking pressure of 20 mTorr or less has been reached, then flow proceeds to block 1032 of FIG. 10 or block 1132 of FIG. 11.

It should be noted that the second baking process includes blocks 1032-1040 of FIG. 10, and blocks 1132-1140 of FIG. 11. Therefore, the noble gas 836 is injected into the repackaged high temperature integrated circuit 820 and the lid seal profile is run at the conclusion of the specified baking time (and optionally, baking pressure) of FIG. 13.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

I claim:

1. A method for assembling a packaged integrated circuit for operating reliably at elevated temperatures, the method comprising:
    providing a finished packaged integrated circuit; extracting a die from the finished packaged integrated circuit, wherein the extracted die is a functional semiconductor die;
    providing an extended bond pad over an original die pad of an extracted die to create a modified extracted die, wherein the extended bond pad is a conformal coating in direct contact with the original die pad, wherein providing the extended bond pad comprises:
        printing, by a 3D printer, an extended bond pad on the extracted die, wherein the 3D printer prints the extended bond pad with a conductive material suitable for use as a die pad the extended bond pad comprising a first portion over the original die pad and a second portion adjacent to and connected to the first portion, wherein the second portion is not over the original die pad and has sufficient area to attach a new ball bond;
    placing the modified extracted die into a cavity of a package base;
    bonding a new bond wire between the extended bond pad and a lead of the package base or a downbond; and
    sealing a package lid to the package base.

2. The method as recited in claim 1, the extended bond pad comprising a plurality of layers, wherein at least one of the layers of the plurality of layers is a different conductive material than a different layer of the plurality of layers.

3. The method as recited in claim 1, wherein providing the extended bond pad comprises:
    sputtering a redistribution layer comprising the extended bond pad on the extracted die, the redistribution layer comprising a conductive material suitable for use as a die pad.

4. The method as recited in claim 1, wherein the 3D printer prints the first portion and second portion of the extended bond pad, wherein the thickness of the second portion of the extended bond pad is the same as or greater than the thickness of the first portion of the extended bond.

5. The method as recited in claim 4, further comprising:
    vacuum baking the package lid and the package base, after bonding and before sealing, wherein vacuum baking comprises baking the package lid and the package base at a temperature of at least 200 degrees Celsius for at least one half hour.

6. The method as recited in claim 5, wherein just prior to sealing the lid to the base, a noble gas is injected into the cavity, wherein the noble gas is injected into the cavity at a pressure between 0.1 to 2 Atmospheres (ATM), at a temperature between 200 degrees Celsius and 275 degrees Celsius.

7. The method as recited in claim 1, bonding the new bond wire comprising:
    ultrasonically bonding a new bond wire to the second portion of the extended bond pad, wherein a new ball bond or wedge bond provides interconnection between the new bond wire and the extended bond pad.

8. The method as recited in claim 7, further comprising:
    repeating providing and bonding for a plurality of original die pads, a plurality of extended bond pads, and a plurality of new bond wires.

9. The method as recited in claim 1, wherein an original ball bond is present on the extracted die, wherein the first portion covers the original ball bond.

* * * * *

UNITED STATES PATENT AND TRADEMARK OFFICE
CERTIFICATE OF CORRECTION

| | | |
|---|---|---|
| PATENT NO. | : 9,966,319 B1 | Page 1 of 1 |
| APPLICATION NO. | : 13/785959 | |
| DATED | : May 8, 2018 | |
| INVENTOR(S) | : Erick Merle Spory | |

It is certified that error appears in the above-identified patent and that said Letters Patent is hereby corrected as shown below:

In the Claims

Column 19, Line 51 - Column 20, Line 17, replace Claim 1 with the following:
1. A method for assembling a packaged integrated circuit for operating reliably at elevated temperatures, the method comprising:
providing a finished packaged integrated circuit;
extracting a die from the finished packaged integrated circuit, wherein the extracted die is a functional semiconductor die;
providing an extended bond pad over an original die pad of the extracted die to create a modified extracted die, wherein the extended bond pad is a conformal coating in direct contact with the original die pad, wherein providing the extended bond pad comprises:
printing, by a 3D printer, the extended bond pad on the extracted die, wherein the 3D printer prints the extended bond pad with a conductive material suitable for use as a die pad, the extended bond pad comprising a first portion over the original die pad and a second portion adjacent to and connected to the first portion, wherein the second portion is not over the original die pad and has sufficient area to attach a new ball bond;
placing the modified extracted die into a cavity of a package base;
bonding a new bond wire between the extended bond pad and a lead of the package base or a downbond; and
sealing a package lid to the package base.

Column 20, Lines 28 - 32, replace Claim 4 with the following:
4. The method as recited in claim 1, wherein the 3D printer prints the first portion and second portion of the extended bond pad, wherein the thickness of the second portion of the extended bond pad is the same as or greater than the thickness of the first portion of the extended bond pad.

Signed and Sealed this
Fifth Day of June, 2018

Andrei Iancu
*Director of the United States Patent and Trademark Office*